(12) United States Patent
Mueller et al.

(10) Patent No.: US 6,307,397 B1
(45) Date of Patent: Oct. 23, 2001

(54) REDUCED VOLTAGE INPUT/REDUCED VOLTAGE OUTPUT REPEATERS FOR HIGH CAPACITANCE SIGNAL LINES AND METHODS THEREFOR

(75) Inventors: Gerhard Mueller, Wappingers Falls; David R. Hanson, Brewster, both of NY (US)

(73) Assignee: InfineonTechnologies AG, Munich (DE)

( * ) Notice: Subject to any disclaimer, the term of this patent is extended or adjusted under 35 U.S.C. 154(b) by 0 days.

(21) Appl. No.: 09/491,646

(22) Filed: Jan. 27, 2000

Related U.S. Application Data

(63) Continuation of application No. 09/037,289, filed on Mar. 9, 1998, now Pat. No. 6,181,165.

(51) Int. Cl.$^7$ .................... H03K 19/02; H03K 19/175
(52) U.S. Cl. ................ 326/81; 326/56; 326/57; 326/58; 326/68; 326/80
(58) Field of Search ............ 362/30, 31, 56–58, 362/83, 86, 68, 80–81

(56) References Cited

U.S. PATENT DOCUMENTS

| | | | | |
|---|---|---|---|---|
| 5,179,299 | * | 1/1993 | Tippon ........................ | 307/443 |
| 5,202,593 | * | 4/1993 | Huang et al. .................. | 307/475 |
| 5,255,287 | * | 10/1993 | Davies et al. .................. | 375/17 |
| 5,559,996 | * | 9/1996 | Fujioka ........................ | 395/500 |
| 5,801,549 | * | 9/1998 | Cao et al. ...................... | 326/83 |
| 6,137,167 | * | 10/2000 | Ahn et al. ...................... | 257/691 |

* cited by examiner

Primary Examiner—Michael Tokar
Assistant Examiner—Vibol Tan
(74) Attorney, Agent, or Firm—Stanton C. Braden

(57) ABSTRACT

A method in an integrated circuit for implementing a reduced voltage repeater circuit on a signal line having thereon reduced voltage signals. The reduced voltage signals has a voltage level that is below $V_{DD}$. The reduced voltage repeater circuit is configured to be coupled to the signal line and having an input node coupled to a first portion of the signal line for receiving a first reduced voltage signal and an output node coupled to a second portion of the signal line for outputting a second reduced voltage signal. The method includes coupling the input node to the first portion of the signal line. The input node is coupled to an input stage of the reduced voltage repeater circuit. The input stage is configured to receive the first reduced voltage signal on the signal line. The input stage is also coupled to a level shifter stage that is arranged to output a set of level shifter stage control signals responsive to the first reduced voltage signal. A voltage range of the set of level shifter stage control signals is higher than a voltage range associated with the first reduced voltage signal. There is further included coupling the output node to the second portion of the signal line. The output node also is coupled to an output stage of the reduced voltage repeater circuit. The output stage is configured to output the second reduced voltage signal on the output node responsive to the set of level shifter stage control signals. A voltage range of the second reduced voltage signal is lower than the voltage range of the set of level shifter stage control signals.

62 Claims, 18 Drawing Sheets

REDUCED VOLTAGE INPUT/REDUCED VOLTAGE OUTPUT REPEATERS FOR HIGH CAPACITANCE SIGNAL LINES AND METHODS THEREFOR

This application is a continuation in part of U.S. patent application Ser. No. 09/037,289 entitled "Reduced voltage input/reduced voltage output ti-state buffers and methods therefor," filed Mar. 9, 1998 U.S. Pat. No. 6,181,165, which is incorporated herein by reference.

RELATED APPLICATIONS

This application is related to the following applications, which are filed on the same date herewith and incorporated herein by reference:

Application entitled "MIXED SWING VOLTAGE REPEATERS FOR HIGH RESISTANCE OR HIGH CAPACITANCE SIGNAL LINES AND METHODS THEREFOR" filed by inventors Gerhard Mueller and David R. Hanson on the same date.

Application entitled "FULL SWING VOLTAGE INPUT/ FULL SWING VOLTAGE OUTPUT BI-DIRECTIONAL REPEATERS FOR HIGH RESISTANCE OR HIGH CAPACITANCE B-DIRECTIONAL SIGNAL LINES AND METHODS THEREFOR" filed by inventors Gerhard Mueller and David R. Hanson on the same date.

BACKGROUND OF THE INVENTION

The present invention relates to repeater circuits for high resistance and/or high capacitance signal lines on an integrated circuit. More particularly, the present invention relates to reduced voltage input/reduced voltage output repeaters which, when employed on a high resistance and/or high capacitance signal line, reduces the signal propagation delay, power dissipation, chip area, electrical noise, and/or electromigration.

In some integrated circuits, there exist signal lines which span long distances and/or coupled to many circuits. In modern dynamic random access memory circuits, for examples, certain unidirectional signal lines such as address lines may be coupled to many circuits and may therefore have a high capacitive load and/or resistance associated therewith. Likewise, certain bi-directional lines such as read write data (RWD) lines may also be coupled to many circuits and may therefore also have a high capacitive load and/or resistance associated therewith. The same issue also applies for many signal lines in modern microprocessors, digital signal processors, or the like. By way of example, the same issue may be seen with loaded read data lines and write data lines of memory circuits, clock lines of an integrated circuit, command lines, and/or any loaded signal carrying conductor of an integrated circuit. The propagation delay times for these signal lines, if left unremedied, may be unduly high for optimal circuit performance.

To facilitate discussion, FIG. 1 illustrates an exemplary signal line 100, representing a signal conductor that may be found in a typical integrated circuit. Signal line 100 includes resistors 102 and 104, representing the distributed resistance associated with signal line 100. Resistors 102 and 104 have values which vary with, among others, the length of signal line 100. There are also shown capacitors 106 and 108, representing the distributed capacitance loads associated with the wire or signal bus and the circuits coupled to signal line 100.

The resistance and capacitance associated with signal line 100 contribute significantly to a signal propagation delay between an input 110 and an output 112. As discussed in a reference entitled "Principles of CMOS VLSI design: A Systems Perspective" by Neil Weste and Kamran Eshraghian, 2nd ed. (1992), the propagation delay of a typical signal line may be approximately represented by the equation $$t_{delay} = 0.7(RC)(n)(n+1)/2 \qquad \text{Eq. 1}$$

wherein n equals the number of section, R equals the resistance value, C equals the capacitance value. For the signal line of FIG. 1, the propagation delay is therefore approximately 2.1 RC (for n=2).

If the resistance value (R) and/or the capacitance value (C) is high, the propagation delay with signal line 100 may be significantly large and may unduly affect the performance of the integrated circuit on which signal line 100 is implemented. For this reason, repeaters are often employed in such signal lines to reduce the propagation delay.

FIG. 2 depicts a signal line 200, representing a signal line having thereon a repeater to reduce its propagation delay. Signal line 200 is essentially signal line 100 of FIG. 1 with the addition of a repeater 202 disposed between an input 210 and an output 212. In the example of FIG. 2, repeater 202 is implemented by a pair of cascaded CMOS inverter gates 204 and 206 as shown. For ease of discussion, repeater 202 is disposed such that it essentially halves the distributed resistance and capacitance of signal line 200.

In this case, the application of Eq. 1 yields a propagation delay of 0.7 (RC)+$t_{DPS}$+$t_{DPS}$+0.7 (RC) or 1.4 (RC)+2$t_{DPS}$, wherein $t_{DPS}$ represents the time delay per inverter stage. Since $t_{DPS}$ may be made very small (e.g., typically 250 ps or less in most cases), the use of repeater 202 substantially reduces the propagation delay of the signal line, particularly when the delay associated with the value of R and/or C is relatively large compared to the value of $t_{DPS}$.

Although the use of CMOS repeater 202 proves to be useful in reducing the propagation delay for some signal lines, such an CMOS inverter-based repeater approach fails to provide adequate performance in reduced voltage input/ reduced voltage output applications. Reduced voltage input refers to input voltages that are lower than the full $V_{int}$ or $V_{DD}$, the internal voltage at which the chip operates. By way of example, if $V_{int}$ is equal to 2 V, reduced voltage signal may swing from 0–1 V or −0.5 V to 0.5 V. In some cases, the reduced voltage may be low enough (e.g., 1 V) that it approaches the threshold voltage of the transistors (typically at 0.7 V or so). Likewise, reduced voltage output refers to output voltages that are lower than the full $V_{int}$, the internal voltage at which the chip operates.

To appreciate the problems encountered when reduced voltage signals are employed in the inverter-based repeater, which is operated at $V_{int}$ or $V_{DD}$, consider the situation wherein the input of the inverter is logically high but is represented by a reduced voltage signal (e.g., around 1 V). In this case, not only does the n-FET of the CMOS inverter stage conduct as expected but the p-FET, which is in series thereto, may also be softly on, causing leakage current to traverse the p-FET. The presence of the leakage current significantly degrades the signal on the output of the repeater circuit (and/or greatly increasing power consumption).

Despite the fact that CMOS inverter-based repeaters do not provide a satisfactory solution in reduced voltage applications, chip designers continue to search for ways to implement repeaters in the reduced voltage integrated circuits. Reduced voltage signals are attractive to designers since reduced voltage signals tend to dramatically reduce the power consumption of the integrated circuit. Further, the use of reduced voltage signals leads to decreased electromigration in the conductors (e.g., aluminum conductors) of the integrated circuit. With reduced electromigration, the chance of developing voids or shorts in the conductors is concomitantly reduced. Further, the reduction in the power consumption also leads to decreased electrical noise since less charge is dumped on the ground and power buses of the integrated circuit at any given time.

As can be appreciated from the foregoing, there is a desire for improved techniques for implementing reduced voltage input/reduced voltage output repeaters on the high resistance and/or high capacitance signal lines of an integrated circuit.

SUMMARY OF THE INVENTION

The invention relates, in one embodiment, to a method in an integrated circuit for implementing a reduced voltage repeater circuit on a signal line having thereon reduced voltage signals. The reduced voltage signals has a voltage level that is below $V_{DD}$. The reduced voltage repeater circuit is configured to be coupled to the signal line and having an input node coupled to a first portion of the signal line for receiving a first reduced voltage signal and an output node coupled to a second portion of the signal line for outputting a second reduced voltage signal. The method includes coupling the input node to the first portion of the signal line. The input node is coupled to an input stage of the reduced voltage repeater circuit. The input stage is configured to receive the first reduced voltage signal on the signal line. The input stage is also coupled to a level shifter stage that is arranged to output a set of level shifter stage control signals responsive to the first reduced voltage signal. A voltage range of the set of level shifter stage control signals is higher than a voltage range associated with the first reduced voltage signal.

There is further included coupling the output node to the second portion of the signal line. The output node also is coupled to an output stage of the reduced voltage repeater circuit. The output stage is configured to output the second reduced voltage signal on the output node responsive to the set of level shifter stage control signals. A voltage range of the second reduced voltage signal is lower than the voltage range of the set of level shifter stage control signals.

In another embodiment, the invention relates to a method, in an integrated circuit, for implementing a reduced voltage repeater circuit on a signal line having thereon reduced voltage signals. The reduced voltage signals has a voltage level that is below $V_{DD}$. The reduced voltage repeater circuit is configured to be coupled to the signal line and has an input node coupled to a first portion of the signal line for receiving a first reduced voltage signal and an output node coupled to a second portion of the signal line for outputting a second reduced voltage signal. The method includes receiving the first reduced voltage signal using an input stage of a reduced voltage repeater circuit, the input stage being coupled to the input node. Additionally, there is included forming, using a level shifter stage of the reduced voltage repeater circuit, a set of control signals responsive to the first reduced voltage signal, a voltage range of the set of control signals being higher than a voltage range associated with the first reduced voltage signal. Furthermore, there is included outputting, using an output stage of the reduced voltage repeater circuit, a second reduced voltage signal responsive to the set of control signals, a voltage range associated with the second reduced voltage signal being lower than the voltage range of the control signals.

In another embodiment, the invention relates to a reduced voltage bi-directional repeater circuit configured to be coupled to a reduced voltage bi-directional repeater circuit on a signal line having thereon reduced voltage signals. The reduced voltage signals has a voltage level that is below $V_{DD}$. The reduced voltage bi-directional repeater circuit is configured to be coupled to the signal line and has a first data port configured to be coupled to a first portion of the signal line and a second data port configured to be coupled to a second portion of the signal line. The repeater circuit includes a first enable node configured to receive a first repeater enable signal at the reduced voltage bi-directional repeater circuit. The first repeater enable signal indicates a direction of signal transmission from the first data port to the second data port. The repeater circuit further includes a second enable node configured to receive a second repeater enable signal at the reduced voltage bi-directional repeater circuit. The second repeater enable signal indicates a direction of signal transmission from the second data port to the first data port, wherein the first data port is coupled to both an input stage of a first reduced voltage repeater circuit and an output stage of a second reduced voltage repeater circuit.

These and other features of the present invention will be described in more detail below in the detailed description of the invention and in conjunction with the following figures.

BRIEF DESCRIPTION OF THE DRAWINGS

The present invention will be readily understood by the followingdetailed description in conjunction with the accompanying drawings, wherein like reference numerals designate like structural elements, and in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known structures and/or process steps have not been described in detail in order to not unnecessarily obscure the present invention.

The invention relates, in one embodiment, to a technique for improving performance in reduced voltage integrated circuits. In accordance with one aspect of the present invention, various reduced voltage tri-state buffer configurations are disclosed as being suitable candidates for unidirectional or bi-directional repeater applications. In accordance with one aspect of the present invention, reduced voltage unidirectional repeaters are employed on high resistance and/or high capacitance unidirectional line(s) of an integrated circuit to reduce the signal propagation delay, power dissipation, chip area, electrical noise, and/or electromigration. In accordance with another aspect of the present invention, reduced voltage bi-directional repeaters are employed on high resistance and/or high capacitance bi-directional line(s) of an integrated circuit to reduce the signal propagation delay, power dissipation, chip area, electrical noise, and/or electromigration of the integrated circuit.

Figure 1:
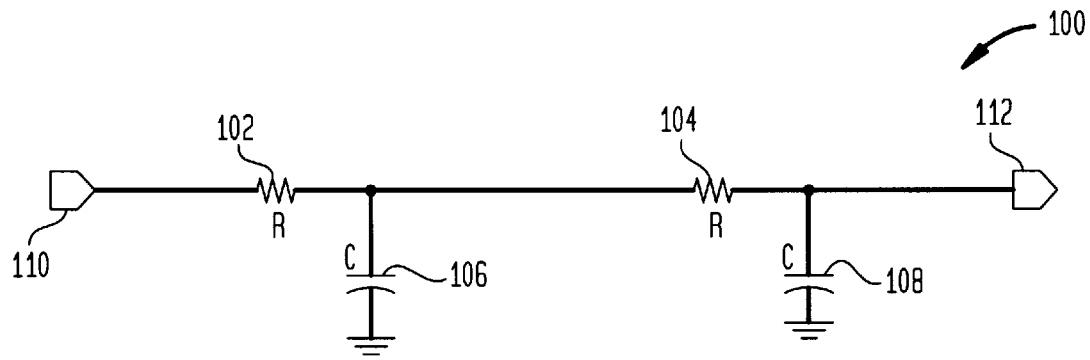
FIG. 1 illustrates an exemplary signal line, representing a signal conductor that may be found in a typical integrated circuit.
Figure 2:
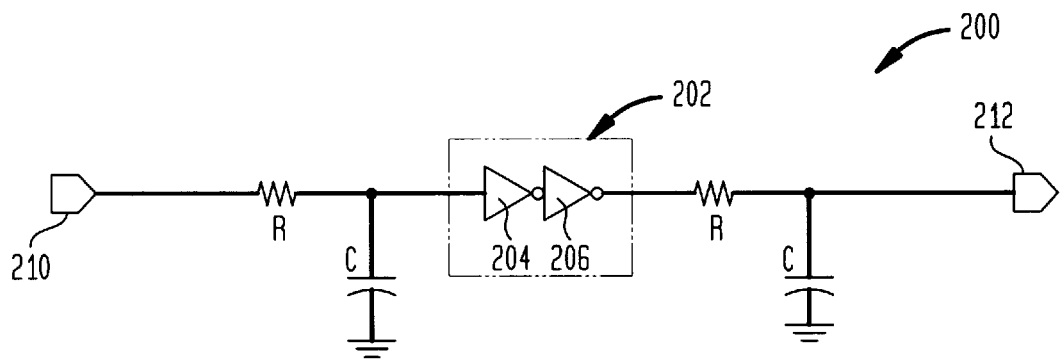
FIG. 2 depicts the signal line of FIG. 1 having thereon a repeater to reduce its propagation delay
Figure 3A:
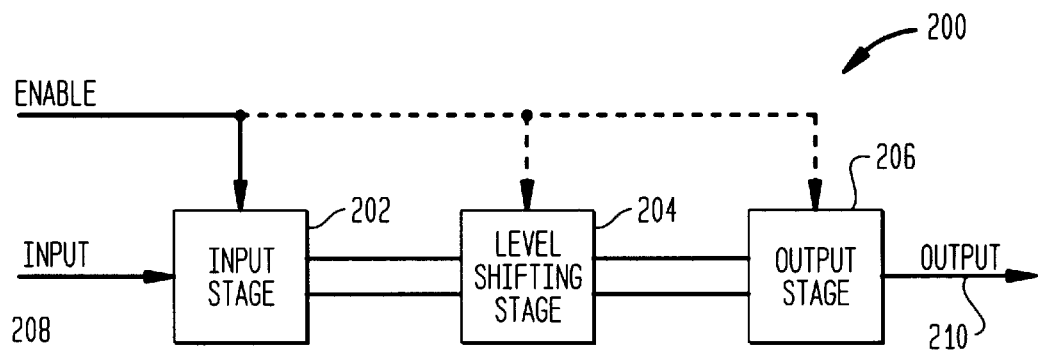
FIG. 3A illustrates, in accordance with one embodiment of the present invention, a simplified reduced voltage signal tri-state buffer circuit, representing a circuit that may be employed as a reduced voltage signal unidirectional repeater.

The features and advantages of the present invention may be better understood with reference to the figures that follow. FIG. 3A illustrates, in accordance with one embodiment of the present invention, a simplified tri-state buffer circuit 200, including input stage 202, level shifting stage 204, and output stage 206. Tri-state buffer circuit 200 represents a repeater circuit suitable for use in a unidirectional low voltage input/low voltage output application. As shown, the buffer enable signal is optionally coupled to input stage 202 to control transistors therein, which pass the reduced voltage input signal on terminal 208 to level shifting stage 204. As will be shown later herein, the buffer enable signal is also employed in some embodiments to control the passage of signals within level shifter stage 204 and/or the output stage 206.

Within level shifting stage 204, transistors therein shift the received input signal to a higher voltage range to control gates of transistors within output stage 206. The higher voltage control signals permit transistors within output stage 206 to be controlled with a higher overdrive voltage, thereby permitting transistors within output stage 206 to source/sink a greater amount of current, thus more rapidly drive the load coupled to the buffer output to the desired reduced voltage level.

Figure 3B:
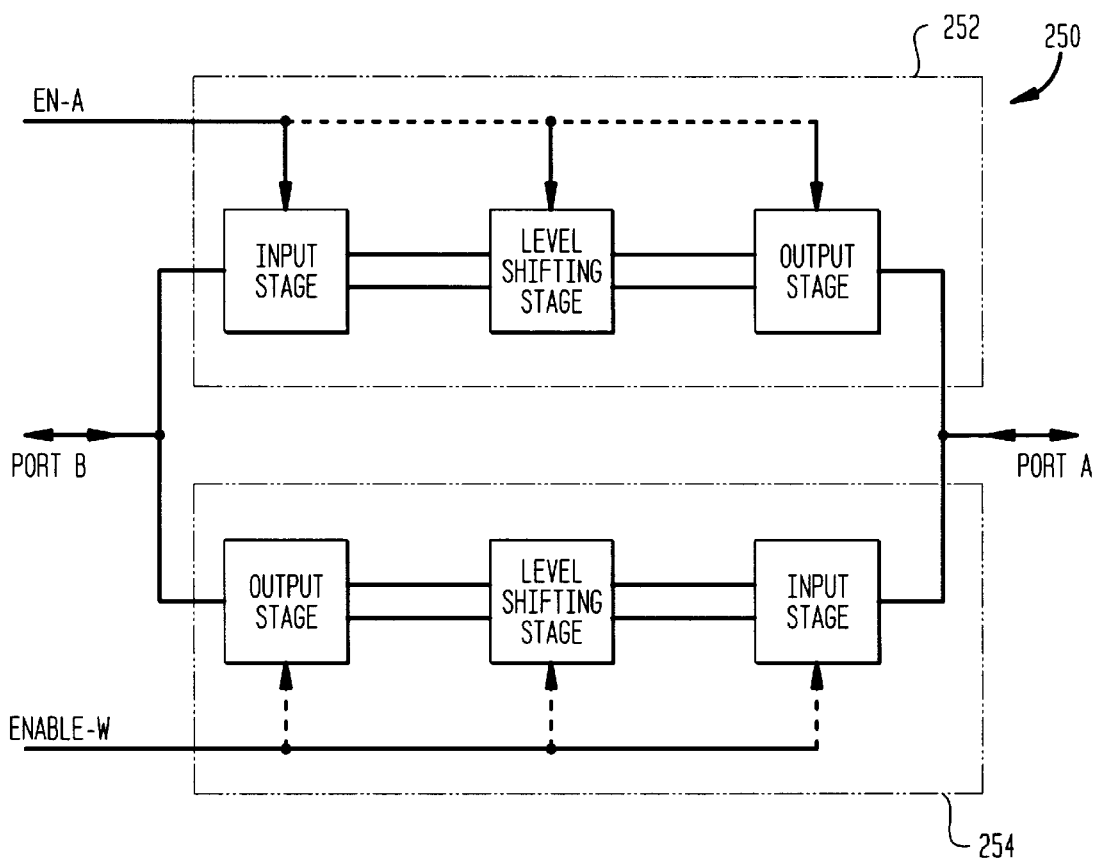
FIG. 3B illustrates, in accordance with one embodiment of the present invention, a simplified reduced voltage bi-directional repeater.

FIG. 3B illustrates, in accordance with one embodiment of the present invention, a simplified bi-directional repeater circuit 250, including two tri-state buffers 252 and 254. Each of tri-state buffers 252 and 254 may be implemented by, for example, the tri-state buffer circuit discussed in connection with FIG. 3A and offers the advantages thereof.

As seen in FIG. 3B, the output of tri-state buffer 252 is coupled to the input of tri-state buffer 254, forming PORT A. Likewise, the output of tri-state buffer 254 is coupled to the input of tri-state buffer 252, forming PORT B. Both tri-state buffers 252 and 254 are controlled by control signals ENABLER and ENABLE-W, which are either complementary signals or both equal to a logic level '0' (ground). Depending on the states of the control signals, PORT A may function as either an input port or an output port for reduced voltage signals (with PORT B functioning as the respective output port or input port). These control signals, which are coupled to the stages of the two tri-state buffers in accordance with techniques of the present invention, allow bi-directional repeater circuit to be implemented in reduced voltage applications such as in RWD signal lines of DRAM ICs.

Figure 4A:
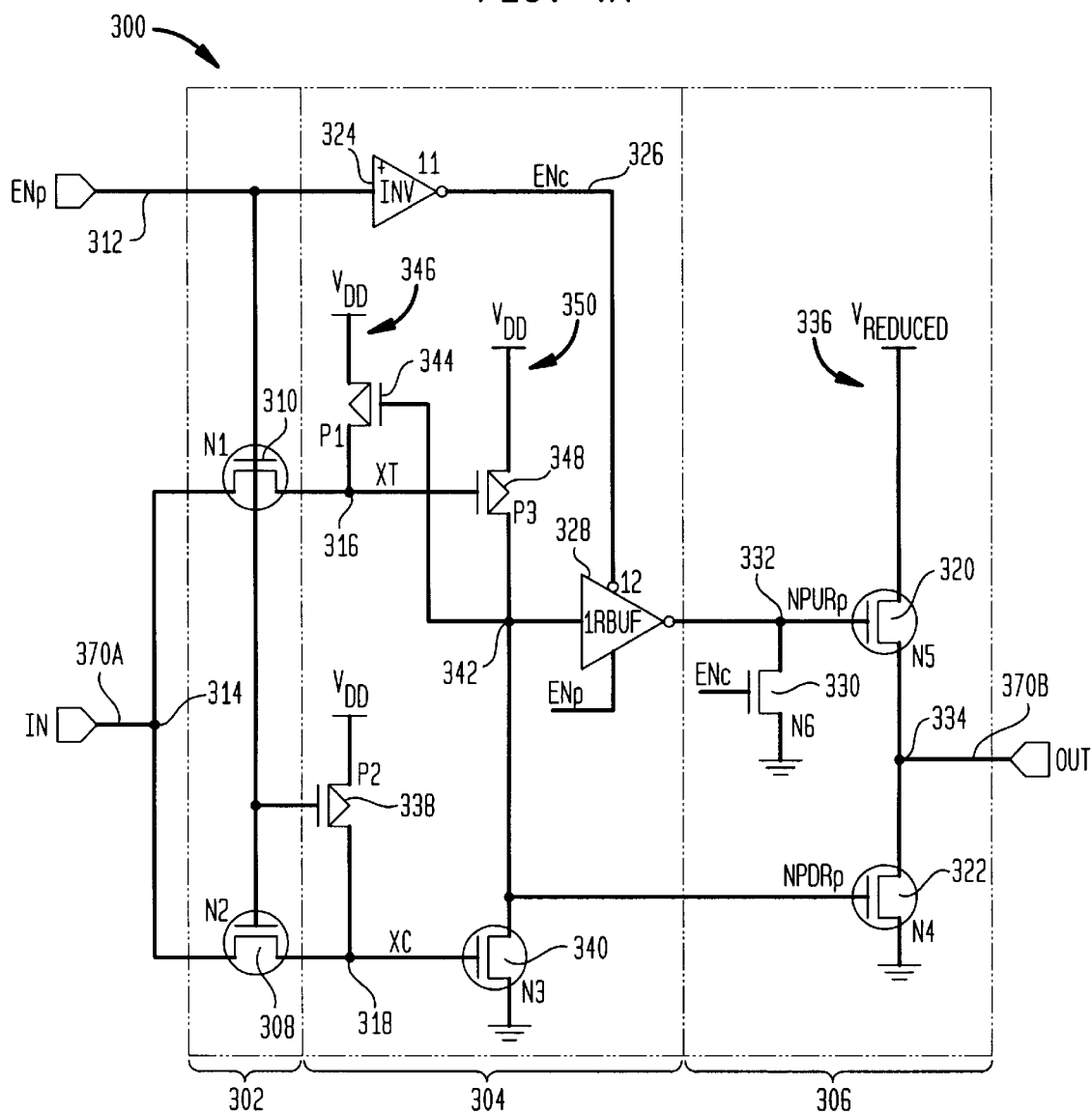
FIG. 4A illustrates, in greater detail and in accordance with one embodiment of the present invention, a tri-state buffer circuit that is capable of passing reduced voltage signals.

FIG. 4A illustrates, in greater detail and in accordance with one embodiment of the present invention, a tri-state buffer circuit 300, representing a non-inverting tri-state buffer capable of accepting a reduced voltage input and driving a load with its reduced voltage output to function as a unidirectional repeater or a building block of a bi-directional repeater. Buffer circuit 300 includes an input stage 302, a level shifter stage 304, and an output stage 306. Input shifter stage 302 includes two field effect transistors (FETs) 308 and 310, whose gates are controlled by buffer enable signal ENp on conductor 312. Note that buffer enable signal ENp and its complement ENc are optional and may be tied high and low respectively without impacting the ability of the circuit of FIG. 4A to function as a basic reduced voltage input/reduced voltage output unidirectional buffer/repeater. The reduced voltage input signal is received at buffer input node 314 and passed by FETs 308 and 310 to nodes 316 and 318 when the buffer enable signal is enabled (i.e., when signal ENp is high).

It should be noted that although FETs 308 and 310 are represented in the drawing as low-threshold n-FETs (the low threshold characteristic is represented by the circle surrounding the transistor symbol), such is not a requirement as long as the threshold voltage of these input transistors is lower than the input voltage range. Low threshold transistors are, however, preferred (but not required) for these transistors. In general, low threshold FETs may have a lower threshold voltage (e.g., about 0.4 V to about 0.5 V) than typical FETs (which may be around 0.6 V–0.7 V).

Level shifter stage 304 receives the signals from input stage 302 and shifts the received signals to a higher voltage range to control gates of FETs 320 and 322 in output stage 306. Depending on the value of the reduced voltage input signal on input node 314, output stage 306 outputs either a logical low ($V_{SS}$) or a logical high (the high value of the reduced voltage range, or $V_{REDUCED}$ herein). Accordingly, a reduced voltage input/reduced voltage output buffer circuit is formed.

Like transistors 310 and 308, output transistors 320 and 322 are represented in the drawing as low-threshold n-FETs (the low threshold characteristic is represented by the circle surrounding the transistor symbol). Although low threshold transistors are preferred for these output transistors for optimum performance, transistors which may have a more typical threshold voltage range may also be employed.

To facilitate further understanding, the operation of tri-state buffer 300 will now be explained in detail. Consider the situation wherein the buffer enable signal is disabled to permit tri-state buffer to enter the tri-state mode. In the circuit of FIG. 4A, the tri-state mode is entered when signal ENp on conductor 312 is low. With low signal ENp, n-type FETs 308 and 310 are off, thereby preventing the signal at input node 314 from being passed to level shifter stage 304. Note that inverters 324 and 328 are operated with an upper power level equal to $V_{DD}$. As the term is employed herein, $V_{DD}$ represents the voltage level at which the integrated circuit operates, which is higher than the reduced voltage level $V_{REDUCED}$ but may be equal to or lower than the voltage level supplied to the integrated circuit from externally.

Inverter 324 causes signal ENc (which is the inverse of signal ENp) to go high on conductor 326, thereby putting tri-state inverter 328 in a high impedance state and decoupling the tri-state inverter output from its input. A high signal ENc also turns on n-FET 330 to pull node 332 low, thereby turning off n-type FET 320. Thus, buffer output 334 is decoupled from voltage source $V_{REDUCED}$ 336.

The low signal ENp on conductor 312 turns on p-type FET 338, thereby pulling node 318 high to turn on n-FET 340. When FET 340 conducts, node 342 is pulled to $V_{SS}$, thereby turning on p-FET 344 of level shifter stage 304. When FET 344 conducts, node 316 is pulled towards $V_{DD}$ (by $V_{DD}$ voltage source 346) to turn off p-FET 348, thereby decoupling node 342 from $V_{DD}$ voltage source 350 and keeping node 342 at the $V_{SS}$ level (due to the fact that FET 340 conducts).

Since node 342 is low, FET 322 is also off, thereby decoupling buffer output 334 from $V_{SS}$. With FETs 320 and 322 off, buffer output 334 is decoupled from the remainder of the buffer circuit, $V_{REDUCED}$, and $V_{SS}$. In other words, buffer circuit 300 is tri-stated and decoupled from the load.

When the buffer enable signal is enabled (i.e., when signal ENp of FIG. 4A is high), buffer circuit 300 is taken out of the tri-state mode. Accordingly, the voltage value on buffer output 334 will vary within the range 0-$V_{REDUCED}$ responsive to the voltage value on input node 314.

Consider the situation when signal ENp is high and a $V_{SS}$ voltage level appears on input node 314. The high signal ENp causes FETs 308 and 310 to turn on, passing the $V_{SS}$ voltage level to nodes 318 and 316 respectively. Since FET 310 conducts, node 316 goes low to turn on FET 348, thereby pulling node 342 to $V_{DD}$ (by $V_{DD}$ voltage source 350). Since ENp is high and its inverted ENc signal is low, tri-state inverter 328 passes the value on node 342 to node 332, causing node 332 to go low (since tri-state inverter 328 inverts its output relative to its input). The low signal ENc turns off FET 330, thereby decoupling node 332 from $V_{SS}$. Since node 332 is at $V_{SS}$, FET 320 is turned off to decouple buffer output 334 from $V_{REDUCED}$ voltage source 336.

The low node 318 (p-FET 338 is turned off by the high ENp signal to ensure that node 318 stays low) turns off FET 340 to decouple node 342 from $V_{SS}$ and ensuring that node 342 stays at the $V_{DD}$ level (due to the fact that FET 348 conducts). With node 342 at the high $V_{DD}$ level, this full $V_{DD}$ voltage is applied to the gate of output FET 322, allowing FET 320 to sink current from the load via buffer output 334 and to quickly pull buffer output 334 to the $V_{SS}$ voltage level. Thus, the presence of level shifter stage 304 allows gates of transistors 320 and 322 to be controlled by control signals having the full voltage range from $V_{SS}$-$V_{DD}$. As can be appreciated from the foregoing, a $V_{SS}$ input signal on input node 314 causes a $V_{SS}$ output signal to appear on output node 334 when buffer circuit 300 is not tri-stated.

Consider the situation when signal ENp is high (i.e., buffer circuit 300 is not tri-stated) and a $V_{REDUCED}$ voltage level appears on input node 314. The high signal ENp causes FETs 308 and 310 to turn on, passing the $V_{REDUCED}$ voltage level to nodes 318 and 316 respectively. Since FET 308 conducts, the $V_{REDUCED}$ voltage level is passed to node 318, thereby turning on FET 340 to pull node 342 to $V_{SS}$ When node 342 is pulled to $V_{SS}$, p-FET 344 is fully on to pull node 316 to about $V_{DD}$ (by $V_{DD}$ voltage source 346). Thus node 316 is at about $V_{DD}$ although the conduction of FET 310 causes $V_{REDUCED}$ to be passed to node 316 from input node 314.

Since node 316 is at about $V_{DD}$, this full $V_{DD}$ voltage is applied to the gate of p-FET 348 to turn FET 348 off, thereby decoupling node 342 from $V_{DD}$ voltage source 350 and ensuring that node 342 stays at the $V_{SS}$ level. It should be appreciated that level shifter stage 304 also functions to stabilize the voltage at node 342 at the $V_{SS}$ value to ensure that FET 322 stays fully off to decouple buffer output 334 from $V_{SS}$. Otherwise, FET 348 may be softly on when $V_{REDUCED}$ is passed to node 316 by FET 310, pulling the voltage at node 342 above the desired $V_{SS}$ value and degrading performance and/or causing the buffer circuit to malfunction and/or consuming an undue amount of power.

With signal ENp high and its inverted signal ENc low, the $V_{SS}$ value on node 342 causes node 332 to go to $V_{DD}$ (since tri-state inverter 328 outputs the inverted value of its input). The low signal ENc also turns off FET 330 to decouple node 332 from $V_{SS}$. With node 332 at the high $V_{DD}$ level, this full $V_{DD}$ voltage is applied to the gate of output FET 320, allowing FET 320 to source current to the load via buffer output 334 and to quickly pull buffer output 334 to the $V_{REDUCED}$ voltage level (by $V_{REDUCED}$ voltage source 336). Thus, the presence of level shifter stage 304 allows gates of transistors 320 and 322 to be controlled by control signals having the full voltage range from $V_{SS}$-$V_{DD}$. As can be appreciated from the foregoing, a $V_{REDUCED}$ input signal on input node 314 causes a $V_{REDUCED}$ output signal to appear on output node 334 when buffer circuit 300 is not tri-stated.

Note that although buffer circuit 300 is configured as a tri-state buffer circuit that is noninverting, such is not a requirement. Accordingly, the inventions herein are not necessarily limited to the inverting (or noninverting) feature of the reduced input voltage/reduced output voltage tri-state buffer circuit.

By using control signals having the full voltage swing ($V_{SS}$-$V_{DD}$) to control gates of output FETs 320 and 322, a higher overdrive voltage is obtained to turn on and off these FETs. If the reduced voltage $V_{REDUCED}$ had been employed to control gates of these output FETs, the FETs would need to be larger to source/sink the same amount of current in the same amount of time. Because the invention employs control signals having the full voltage swing ($V_{SS}$-$V_{DD}$) to control gates of output FETs 320 and 322, these FETs may be made smaller, which reduces space usage on chip.

Reducing the size of the output FETs also reduces the capacitive load to which the buffer circuit is coupled. This is advantageous in applications wherein multiple buffer circuits are employed to assert signals on a common bus conductor and multiple buffer circuit output stages may be coupled to that same common bus. By reducing the size and capacitance associated with the output FETs of the output stage in each buffer circuit, less load capacitance is presented to the buffer circuit that actually drives the bus conductor. With reduced load capacitance, latency and power consumption is advantageously reduced.

Figure 4B:
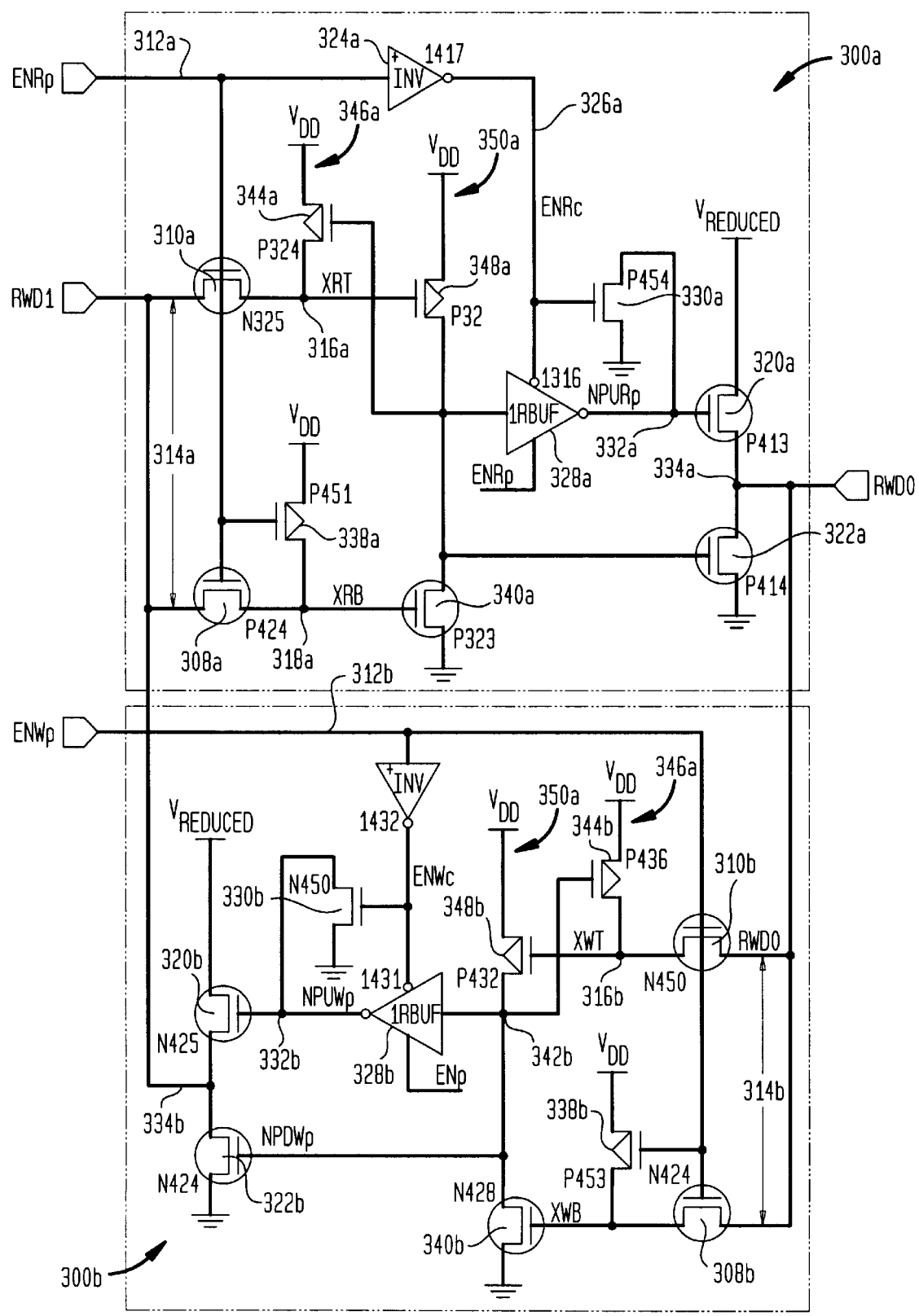
FIG. 4B illustrates, in greater detail and in accordance with one embodiment of the present invention, a reduced voltage bi-directional repeater.

FIG. 4B illustrates, in accordance with one aspect of the present invention, a bi-directional repeater which employs two tri-state buffer circuits 300a and 300b coupled in opposite directions. In one preferred embodiment, each of tri-state buffers 300a and 300b is implemented by the tri-state buffer circuit discussed in connection with FIG. 4A. For ease of illustration and comprehension, the various components of these tri-state buffers are numbered using the same reference numbering system employed in FIG. 4A. To distinguish the components belonging to the upper tri-state buffer 300a from the components belonging to the lower tri-state buffer 300b, however, these reference numbers are appended with the letter "a" or "b".

Control signal ENRp is coupled to the input stage of tri-state buffer 300a and more specifically to nFETs 310a and 308a. Control signal ENRP is also coupled to inverter 324a of the level shifting stage of tri-state buffer 300a. Control signal ENWp, which is the complementary signal of control signal ENRp is coupled to the input stage of tri-state buffer 300b and more specifically to nFETs 310b and 308b. Control signal ENWp is also coupled to inverter 324b of the level shifting stage of tri-state buffer 300b. Note that ENRp and ENWp can also both be equal to a logic level '0' (ground).

In operation, when control signal ENRp is high, tri-state buffer 300a functions as a unidirectional repeater that passes a reduced voltage signal at port RWD1 to RWD0. Reference may be made back to FIG. 4A for specific details pertaining to the operation of tri-state buffer 300a when control signal ENRp is high. At the same time, control signal ENWp goes low, essentially turning off nFETs 308b and 310b of tri-state buffer circuit 300b. Thus, tri-state buffer circuit 300b is essentially tri-stated and decoupled from port RWD0 and port RWD1. In this case, the entire bi-directional repeater circuit of FIG. 4B functions as a unidirectional repeater which passes a reduced voltage input signal at port RWD1 to port RWD0 (i.e., left to right of FIG. 4B).

In the reverse direction, when control signal ENWp is high, tri-state buffer 300b functions as a unidirectional repeater which passes a reduced voltage signal at port RWD0 to RWD1. Again, reference may be made back to FIG. 4A for specific details pertaining to the operation of tri-state buffer 300b when control signal ENWp is high. At the same time, control signal ENRP goes low, essentially turning off nFETs 308a and 310a of tri-state buffer circuit 300a. Thus, tri-state buffer circuit 300a is essentially tri-stated and decoupled from port RWD1 and port RWD0. In this case, the entire bi-directional repeater circuit of FIG. 4B functions as a unidirectional repeater which passes a reduced voltage input signal at port RWD0 to port RWD1 (i.e., right to left of FIG. 4B). In general, the enable signal is preferably valid before the data arrives at the repeater to prevent signal transmission delay.

FIGS. 5–12 depict various alternative embodiments, showing the various exemplary manners in which input stage, the level shifter stage, and/or output stage may be configured. One of ordinary skills in the art will readily appreciate that any of the exemplary embodiments discussed in these figures may be employed as a unidirectional repeater (e.g., for address lines in DRAMs and/or other loaded unidirectional signal carrying conductors in integrated circuits) or as a bi-directional repeater stage (e.g., for RWD lines in DRAMs and/or other loaded bi-directional signal carrying conductors in integrated circuits). In the case of a bi-directional repeater, any of the tri-state buffers shown in FIGS. 4A and 5–12 may be substituted for either of tri-state buffers 252 and 254 of FIG. 3B.

In each of these FIGS. 5–12, the level shifter stage is employed to boost the reduced voltage input signal into control signals having a greater voltage range to control the output transistors in the output stage. The output transistors are connected in series between $V_{REDUCED}$ and $V_{SS}$ to output signals in this reduced voltage range. With the output transistors turned on and off by the higher voltage control signals from the level shifter stage, these transistors can advantageously source or sink a greater amount of current to drive the load with reduced latency.

Figure 5:
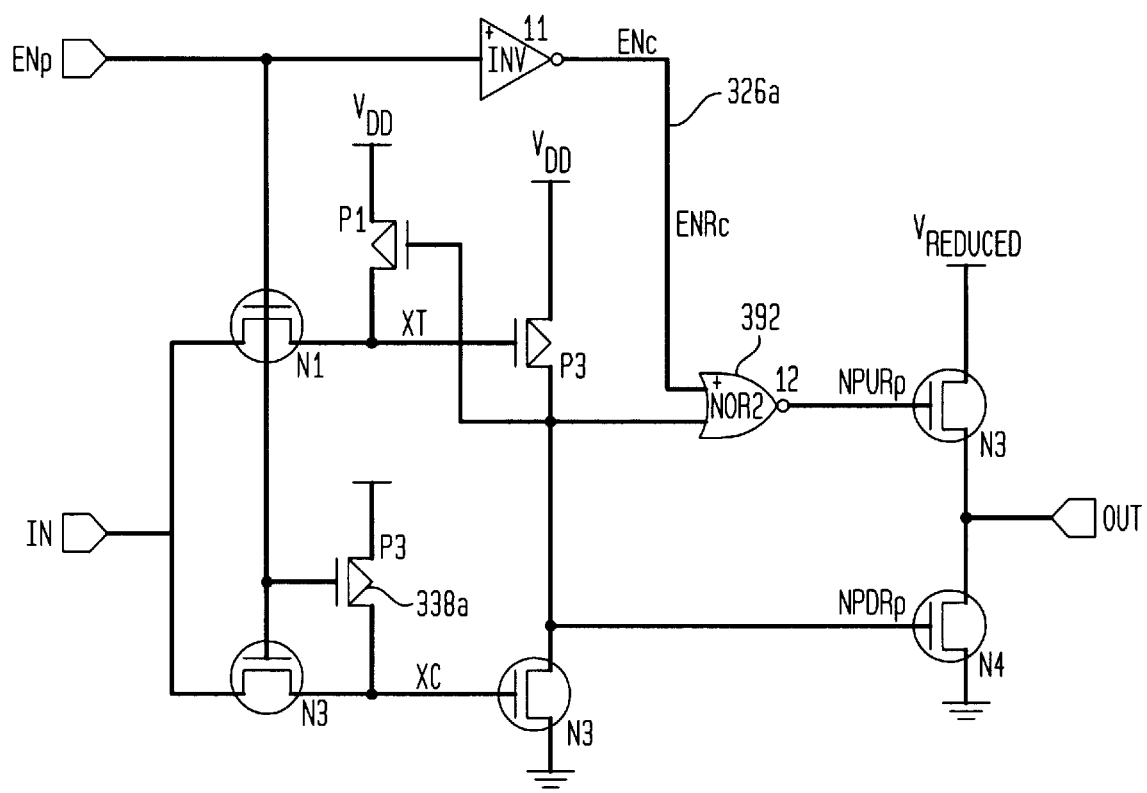
FIGS. 5–12 illustrate, in accordance with various embodiments of the present invention, various alternative configurations of the reduced voltage input/reduced voltage output tri-state buffer circuit that may be employed for a unidirectional repeater or a bi-directional repeater application.
Figure 6:
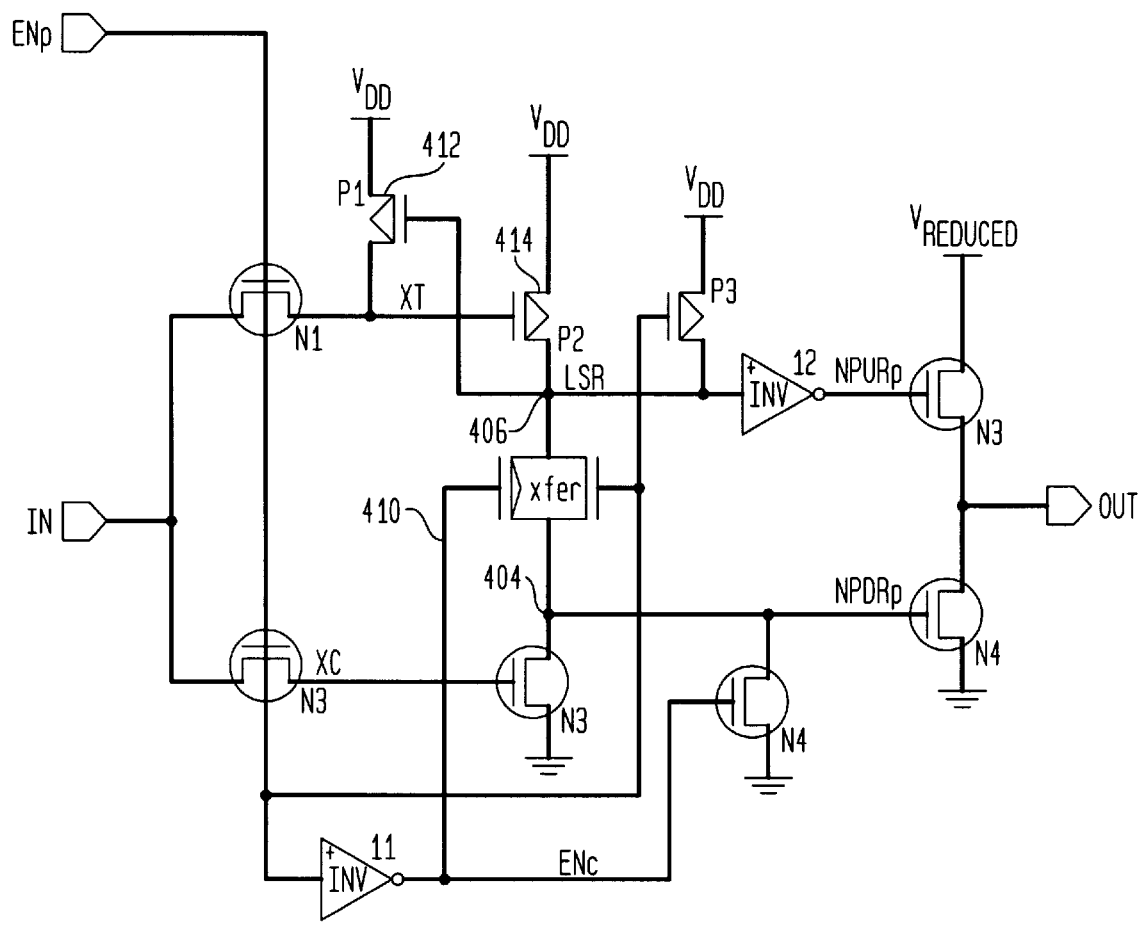

In FIG. 5, the level shifter stage is implemented by a NOR gate 392 instead of a tri-state inverter as in the case of FIG. 4A. In FIG. 6, a transmission gate 402 is employed instead in the level shifter stage. Transmission gate 402 functions to pass the voltage between its two nodes, i.e., between nodes 404 and node 406, responsive to control signals 408 and 410. Again, the level shifter stage comprising transmission gate 402, transistors 412, 414, and 416 ensures that node 404 stays low when a logical high signal having a reduced voltage (e.g., 1 V) appears at the buffer input. The remainder of the buffer of FIG. 6 functions roughly in an analogous manner to the buffer of FIG. 4A, and the operation of the buffer of FIG. 6 is readily understandable to one skilled in the art in view of this disclosure.

Figure 7:
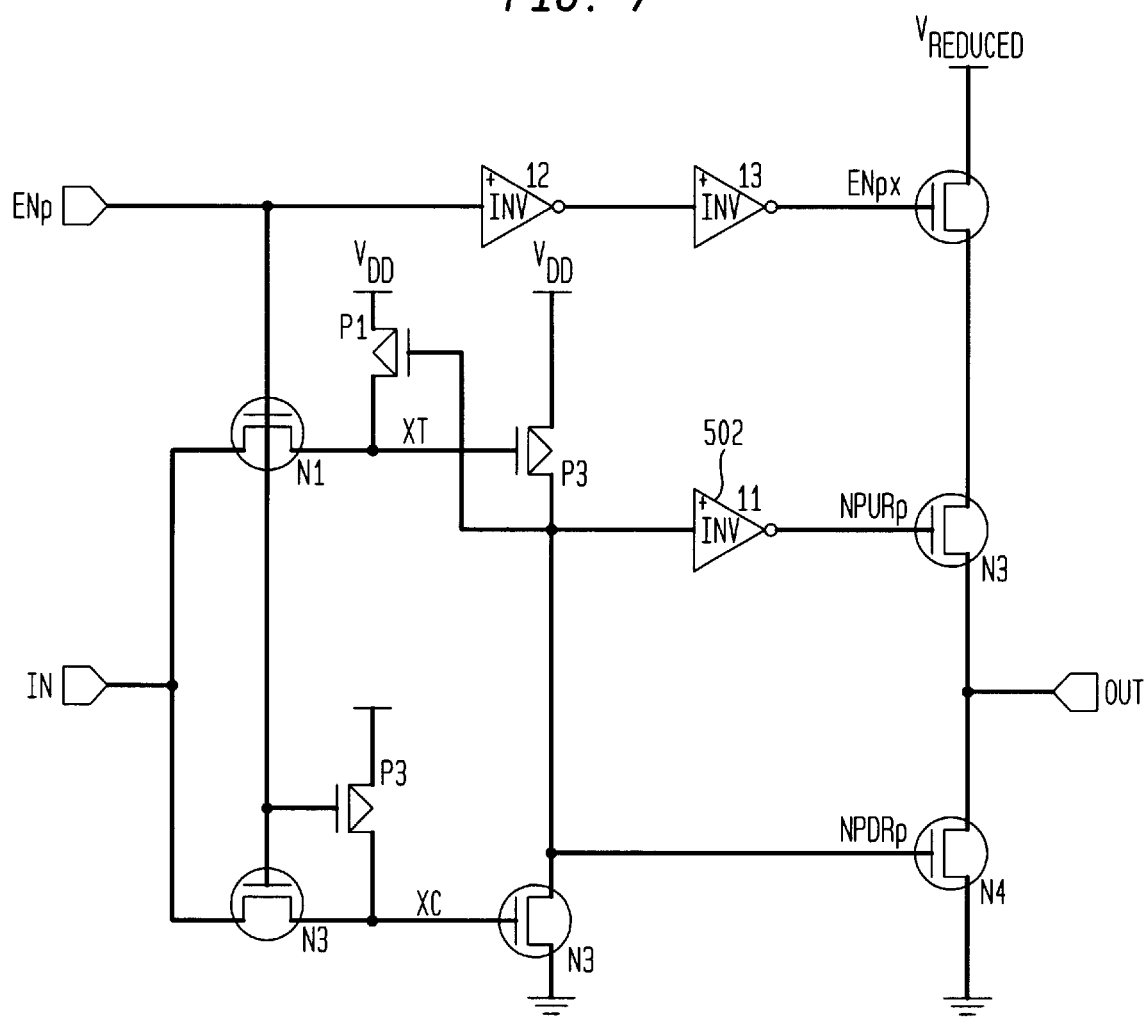
Figure 8:
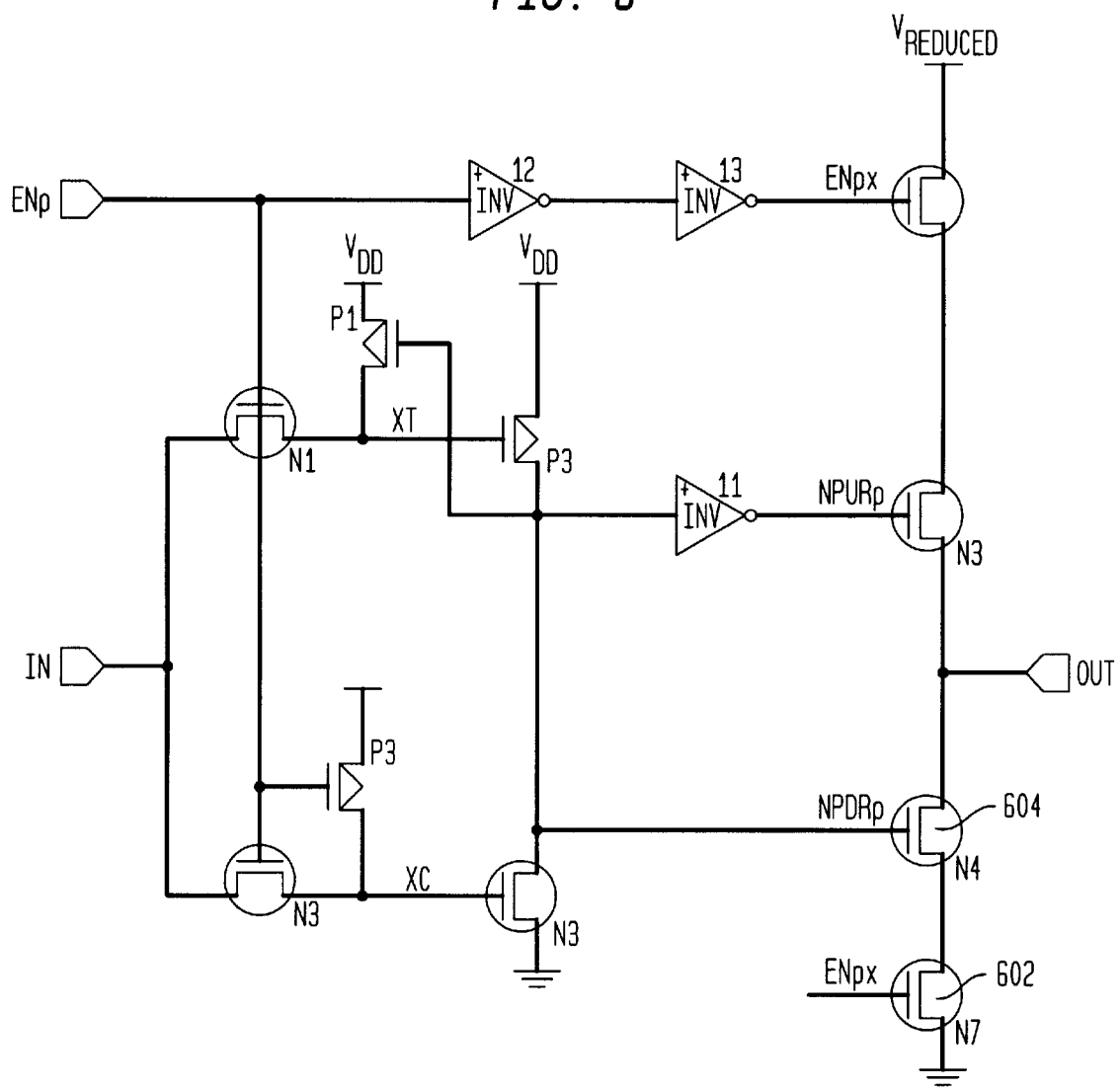

In FIG. 7, an inverter 502 is employed in the level shifter stage to furnish control signals having the voltage range between $V_{SS}$ and $V_{DD}$ to the output transistor 502. Two inverters are shown coupled to the gate of transistor 504 to source sufficient current for properly controlling transistor 504. However, they may be omitted if the buffer enable signal can sufficiently control transistor 504. There are three output transistors in the output stage, of which transistor 504 acts to quickly decouple the $V_{REDUCED}$ voltage source from the output when signal ENp is low. As a tradeoff, however, each of output transistors 504 and 506 may be required to be larger to reduce the resistance in series between the $V_{REDUCED}$ voltage source and the output. The larger transistor 506 may contribute to a higher capacitive load, especially when multiple tri-state buffers are coupled to the same output. In FIG. 8, output transistor 602 is added to ensure that $V_{SS}$ is also quickly decoupled from the output when the ENp signal is low. Again, the tradeoff results in larger transistors 602 and 604 to overcome the series resistance. The remainder of the buffers of FIGS. 7 and 8 function roughly in an analogous manner to the buffer of FIG. 4A, and the operation of these buffers is readily understandable to one skilled in the art in view of this disclosure.

Figure 9:
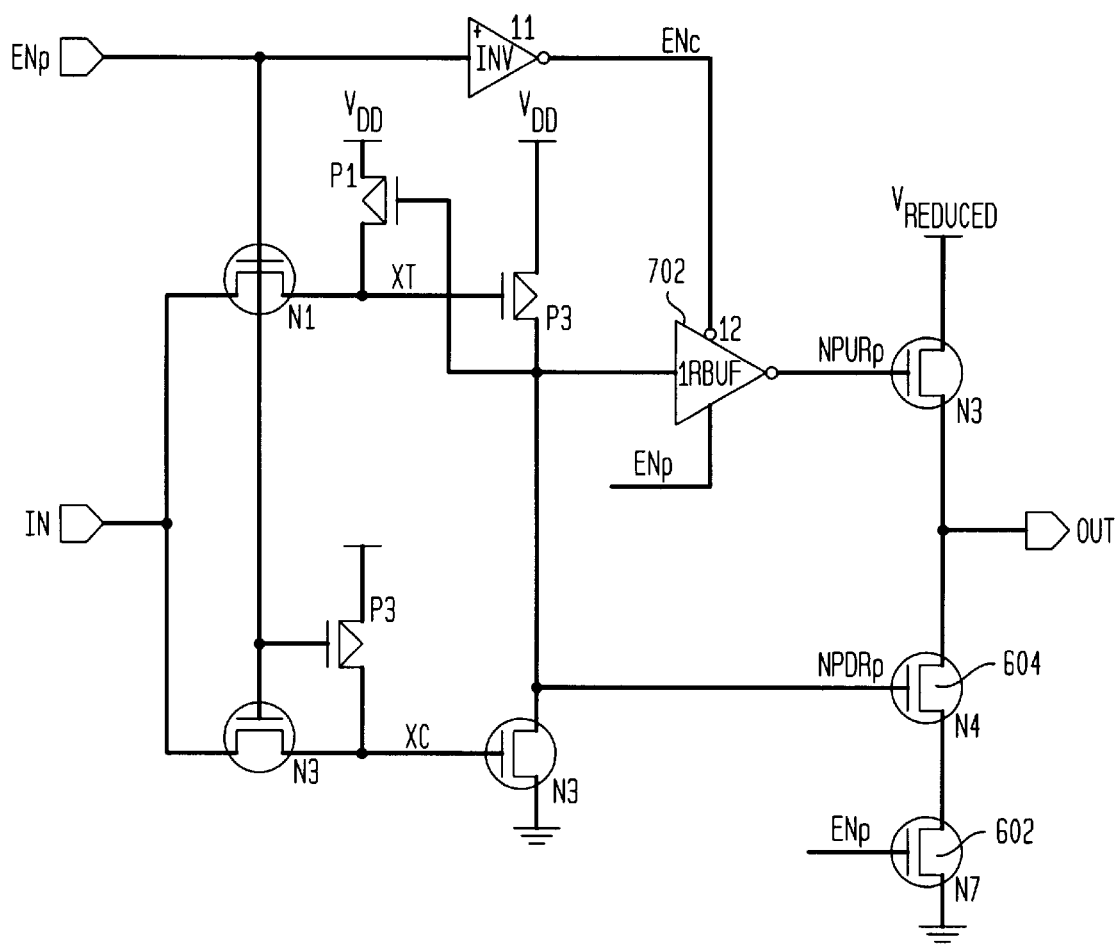
Figure 10:
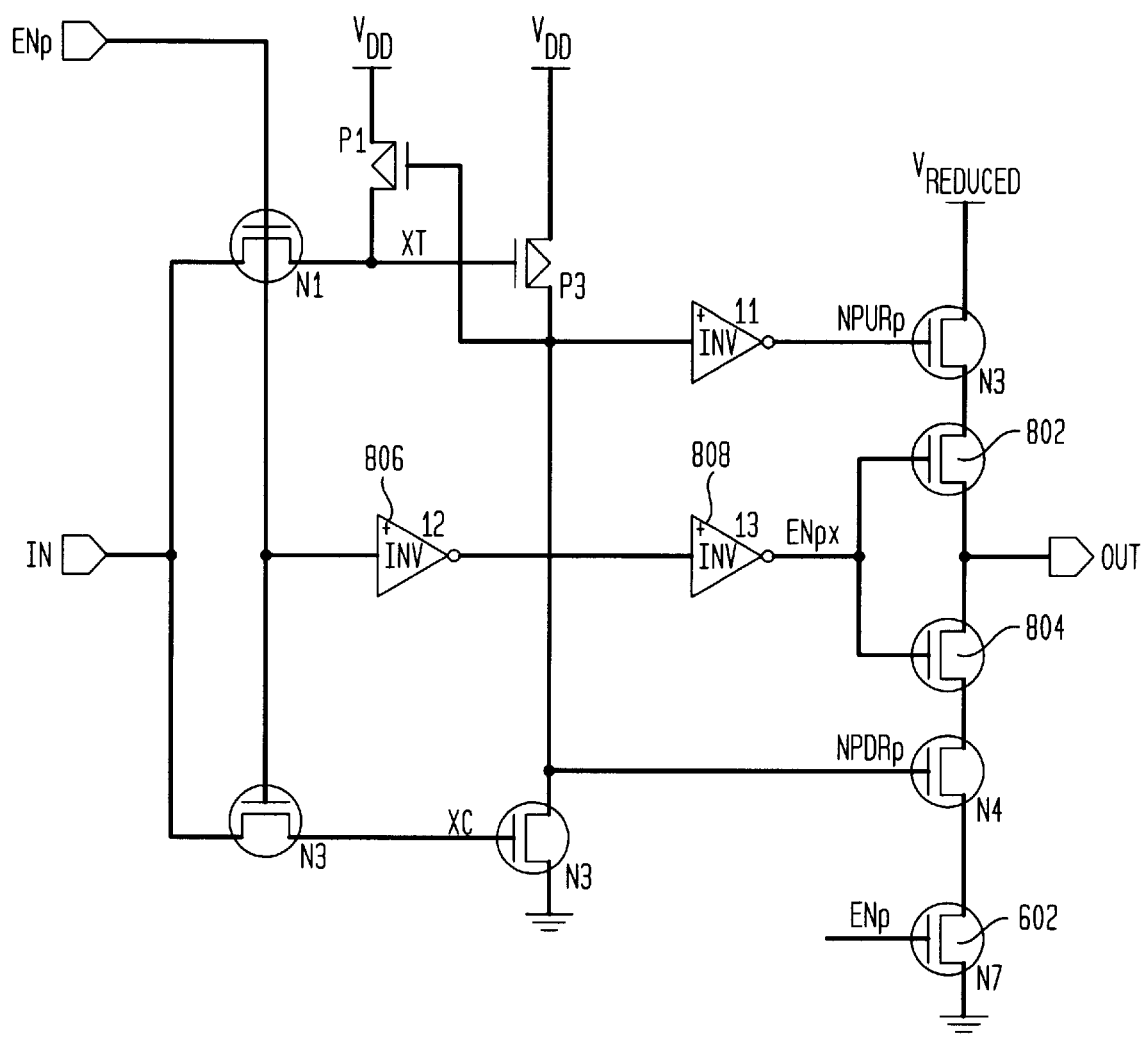
Figure 11:
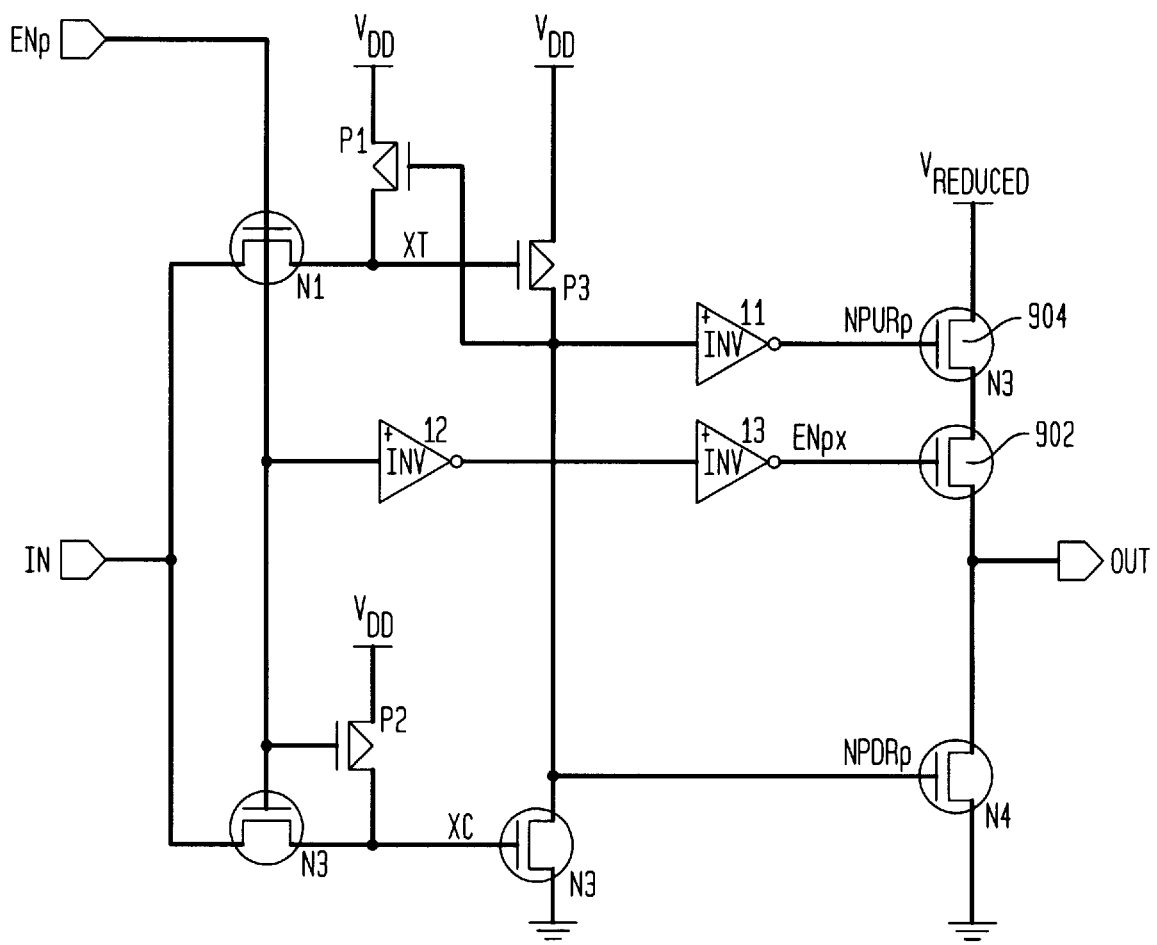
Figure 12:
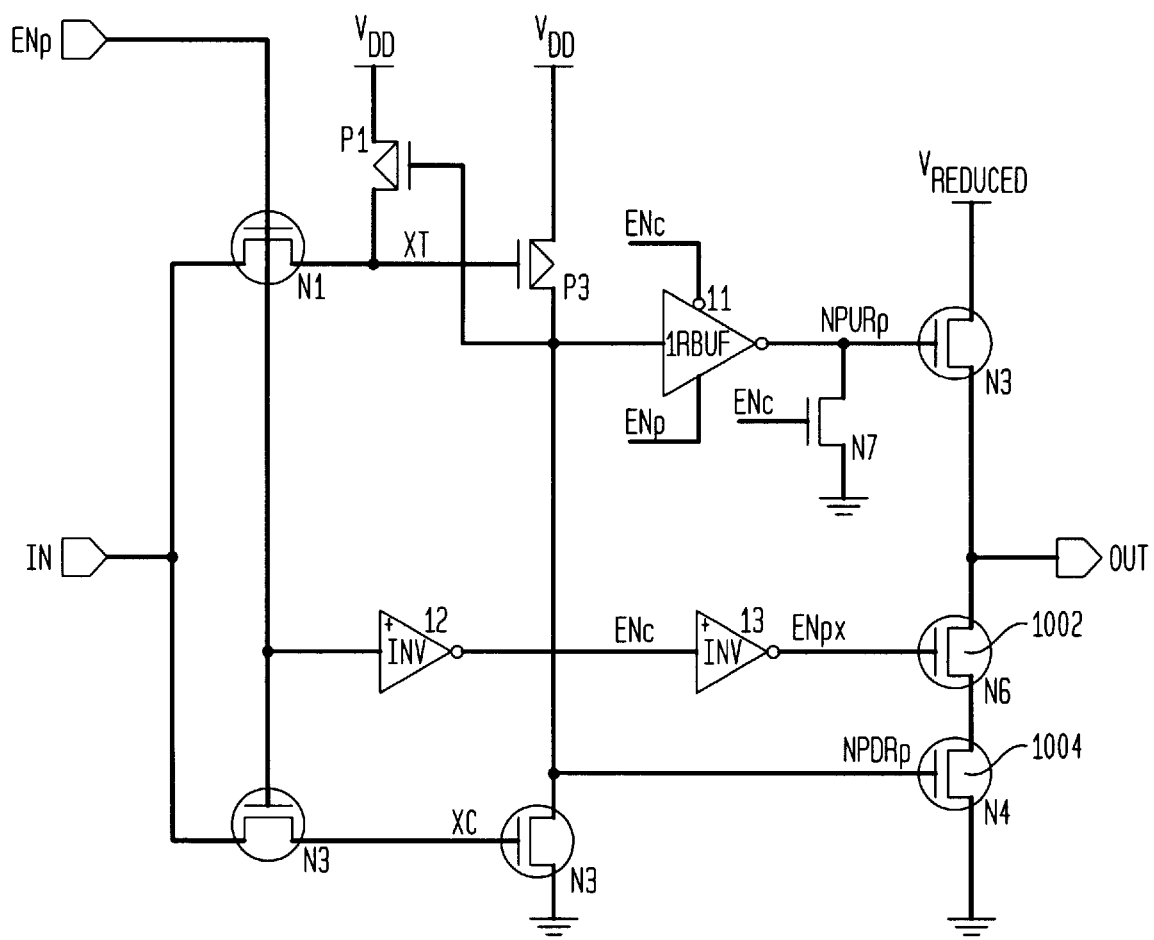

In FIG. 9, a tri-state inverter 702 is employed in the level shifter stage. Tri-state inverter 702 operates in an analogous manner to tri-state inverter 328 of FIG. 4A. In FIG. 10, transistors 802 and 804 in the output stage are coupled to signal ENpx (generated by inverters 806 and 808 of the level shifter stage) to facilitate fast decoupling of the output from both $V_{SS}$ and $V_{REDUCED}$. However, the presence of four transistors in series in the output stage may require larger devices to be employed to overcome the series resistance. In FIG. 11, decoupling of the output from $V_{SS}$ is performed in the same manner as was done in the buffer of FIG. 4A. Decoupling of the output from $V_{REDUCED}$ is accomplished by transistor 902, albeit at the potential cost of requiring larger devices to be employed for transistors 902 and 904. In FIG. 12, decoupling of the output from $V_{REDUCED}$ is performed in the same manner as was done in the buffer of FIG. 4A. Decoupling of the output from $V_{SS}$ is accomplished by transistor 1002, albeit at the potential cost of requiring larger devices to be employed for transistors 1002 and 1004. The remainder of the buffers of FIGS. 9–12 function in a roughly analogous manner to the buffer of FIG. 4A, and the operation of these buffers are readily understandable to one skilled in the art in view of the remainder of this disclosure.

As mentioned earlier, any of the buffers disclosed herein may be employed as a reduced voltage input/reduced voltage output repeater for a unidirectional signal line (such as an address line in a DRAM, a microprocessor, a DSP, or the like). Likewise, any of the buffers disclosed herein may be employed as either the upper half or the lower half of a bi-directional repeater to reduce, among others, the propagation delay associated with high capacitance and/or high resistance bi-directional signal lines.

Figure 13A:
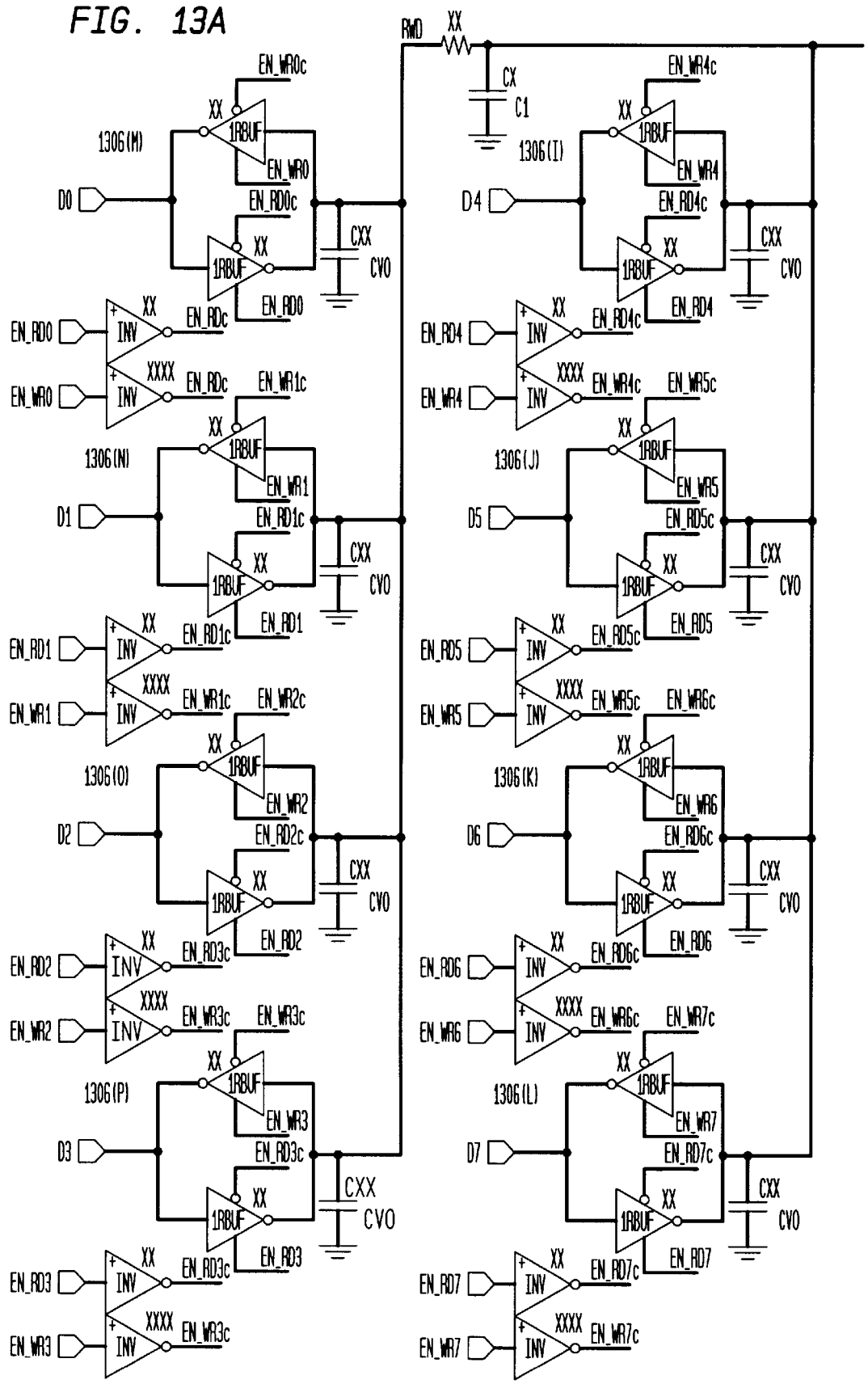
FIG. 13 illustrates, to facilitate discussion, a diagrammatic representation of an exemplary DRAM architecture, including a RWD line.
Figure 13B:
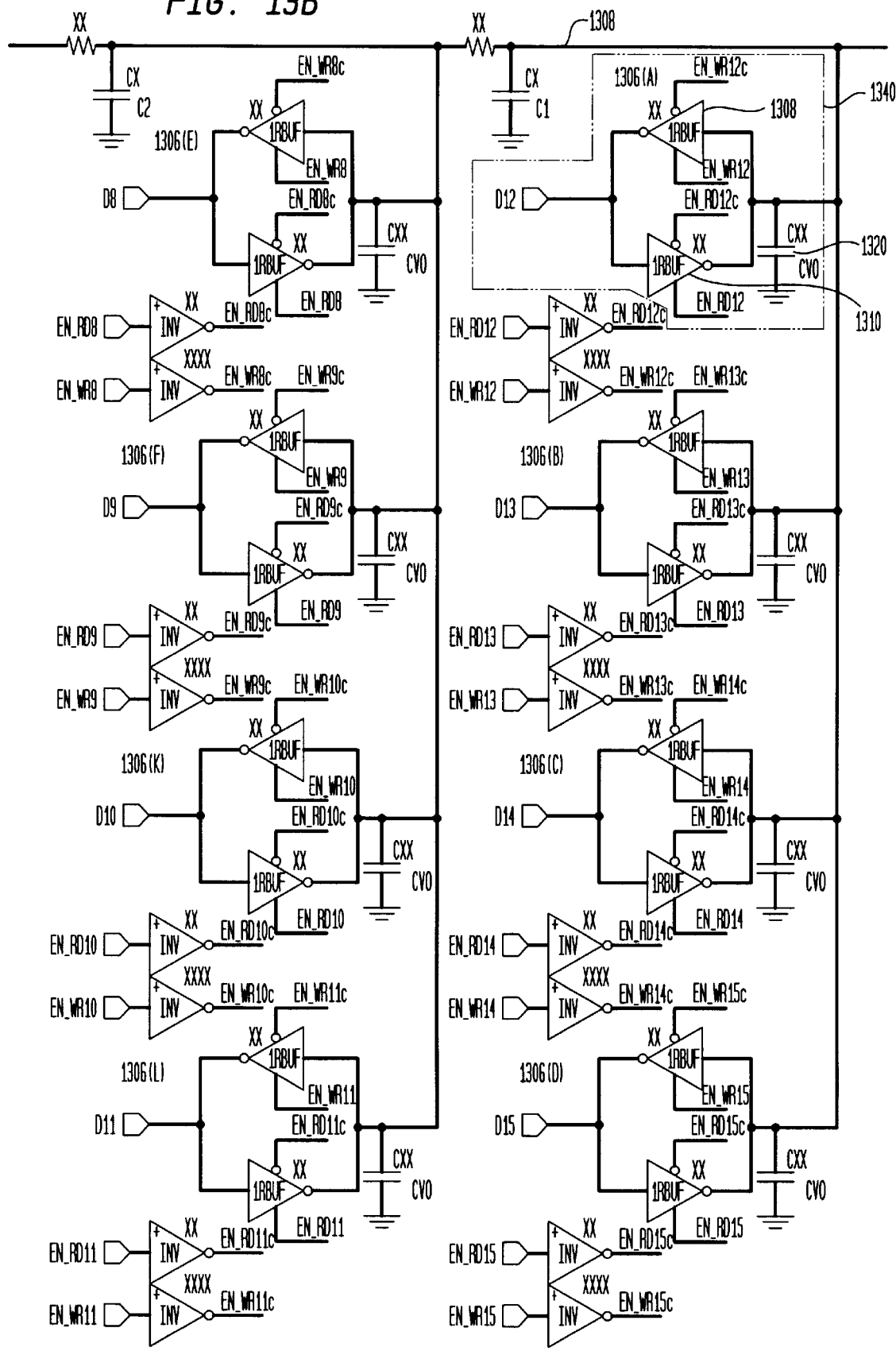
Figure 13C:
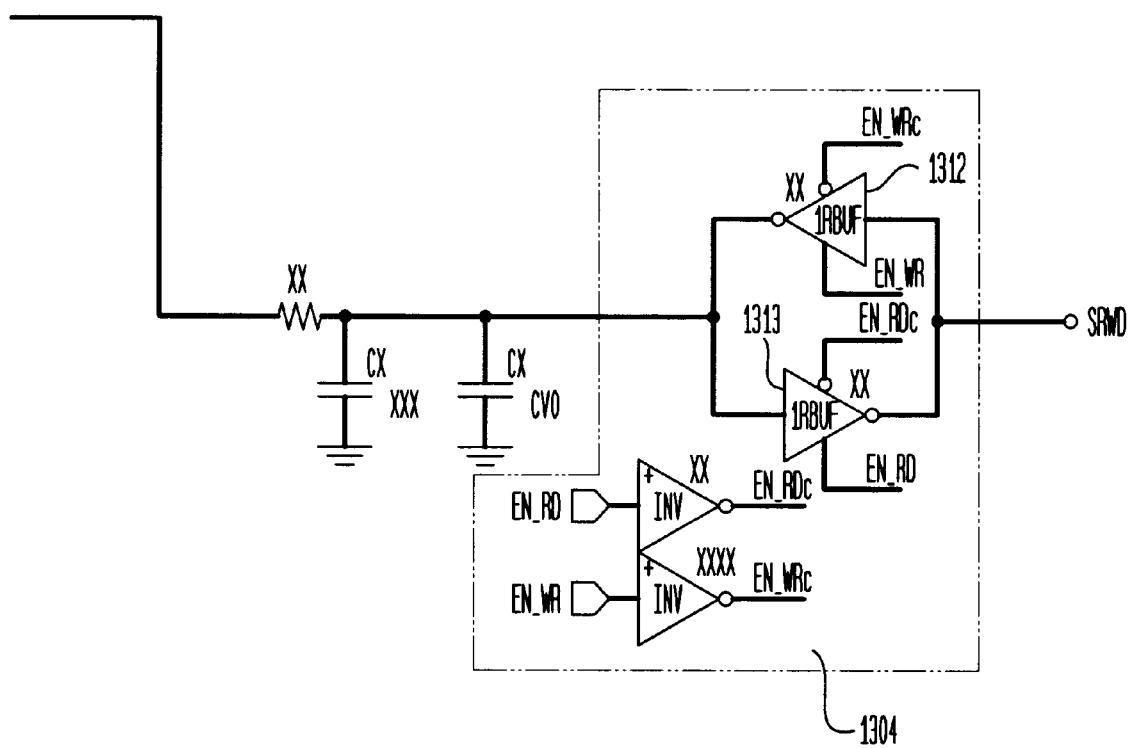

To facilitate discussion of the application of the bi-directional repeater of the present invention in a modern high density integrated circuit, FIGS. 13a, 13b and 13c (referred to collectively herein as FIG. 13) illustrates, a diagrammatic representation of an exemplary DRAM architecture, which shows a RWD line 1302 coupled to a driver/receiver pair 1304 and to each of the sixteen abstract driver/receiver pairs 1306(a)–(p). In FIG. 13, the tri-state buffers within outline 1340 represent the generalized driver/receiver circuit. In this example, each of driver/receiver pairs 1306(a)–(p) represents the driver/receiver pair associated with a second sense amplifier, i.e., the sense amplifier that is employed to further amplify the signal from a cell after that signal has been amplified once by a first sense amplifier.

Data lines D0–D15 from each of the cells represents the data to be read from or written to the cells, or more specifically to the first sense amplifier associated with the cell depending on the state of the signals that control drivers 1308 and 1310 associated with each of these driver/receiver pairs 1306. If data is to be written to the cell that is coupled to data line D12, for example, the bit of data may be received by driver/receiver pair 1304 and driven onto RWD line 1302. Driver 1304 (or more specifically driver 1312 therein) is turned on to pass the data to 1308 which then drives the data onto data line D12 to be written to the cell. If data is to be read from the cell that is coupled to data line D12, for example, the bit of data may be received by driver/receiver pair 1306(a) and driven onto RWD line 1302. Driver/receiver pair 1304 (or more specifically driver 1313 therein) is turned on to pass the data from data line D12 to a FIFO or off-chip driver circuit.

As can be seen, RWD line 1302 is a bi-directional line that is employed to pass data from off chip to one of the cells or from one of the cells to a FIFO or off-chip driver circuit and ultimately off chip. Note that for simplicity the FIFO and/or off-chip driver circuits have been omitted. With reference to FIG. 13, each driver/receiver pair 1306 has associated with it a capacitor 1320, representing the capacitive load of that driver/receiver pair 1306 as seen from RWD line 1302 and includes the input capacitance of driver 1308 as well as the output capacitance of driver 1310. RWD line 1302 then has a capacitive load distributed along its length that includes the capacitance associated with each of the driver/receiver pair 1306 as well as the capacitance of the RWD line itself. Furthermore, RWD line 1302 is a long signal line and tends to have a significant resistance along its length, particularly between driver/receiver pair 1306 (such as driver/receiver pair 1306(p)) and driver/receiver pair 1304. The large resistance and capacitance associated with RWD line 1302 degrades performance both when writing to a cell and when reading therefrom.

Figure 14A:
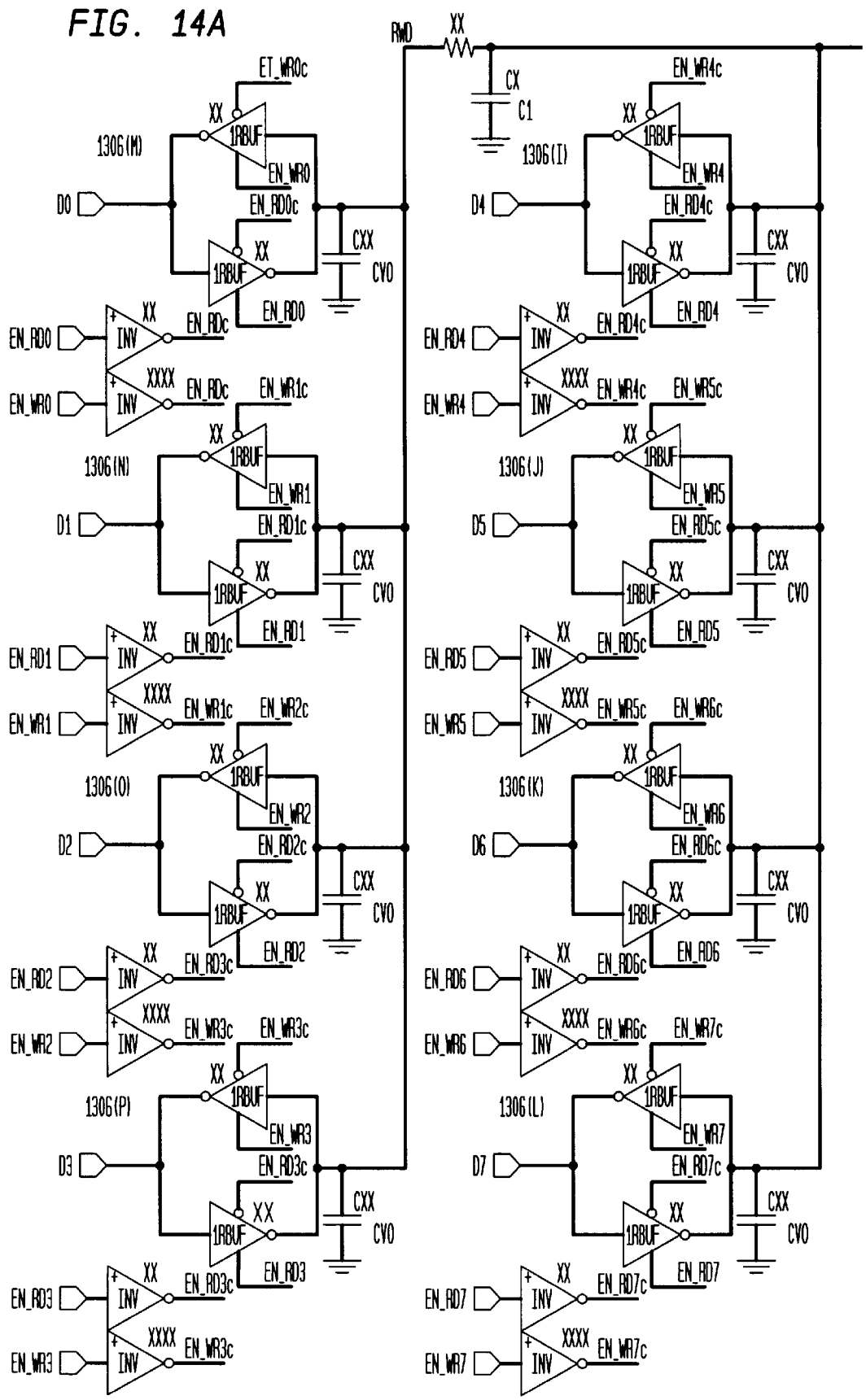
FIGS. 14a, 14b and 14c illustrate a representation of the DRAM architecture of FIGS. 13a, 13b and 13c, including a bi-directional repeater implemented on the RWD line in accordance with one embodiment of the present invention.
Figure 14B:
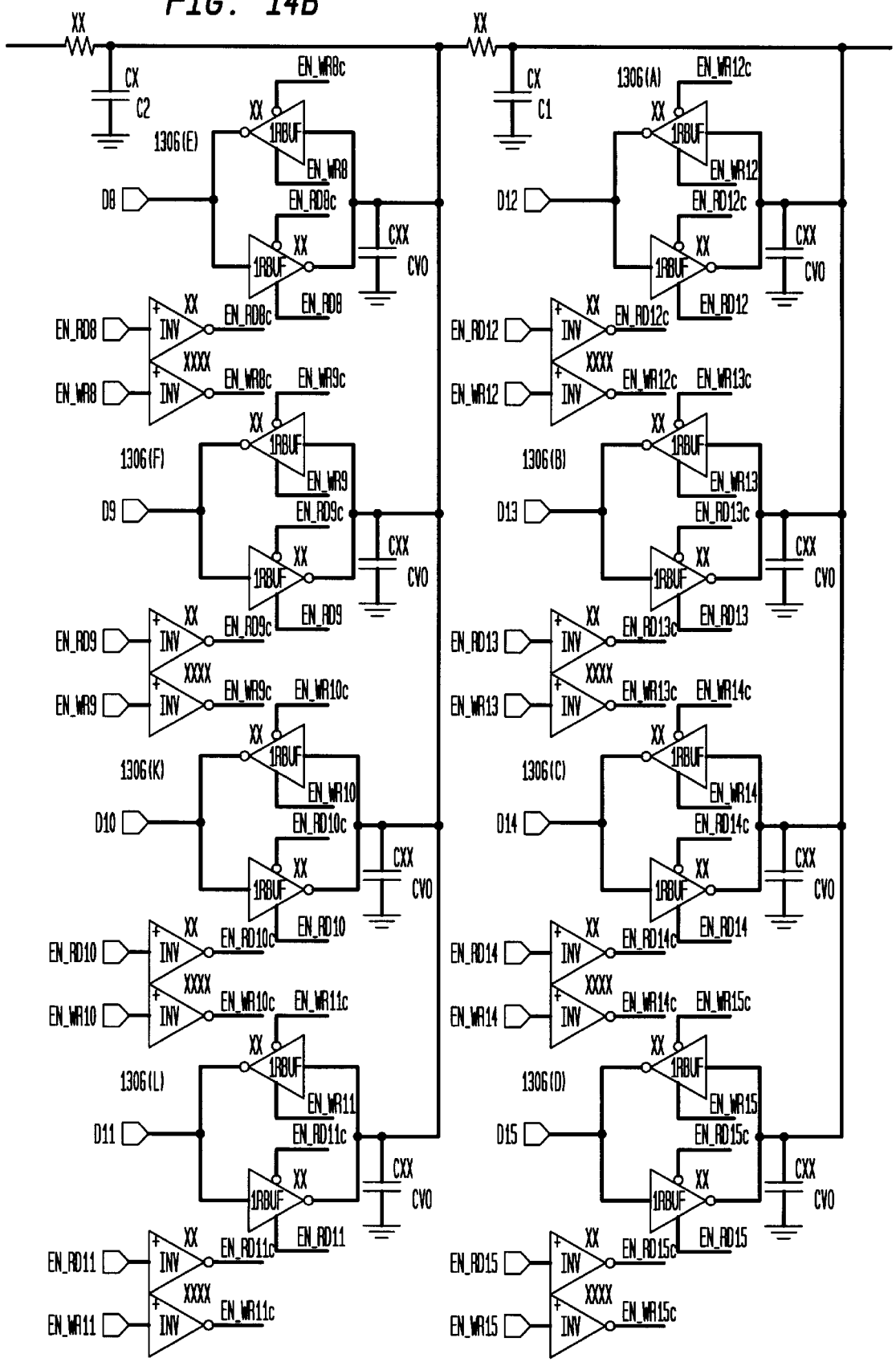
Figure 14C:
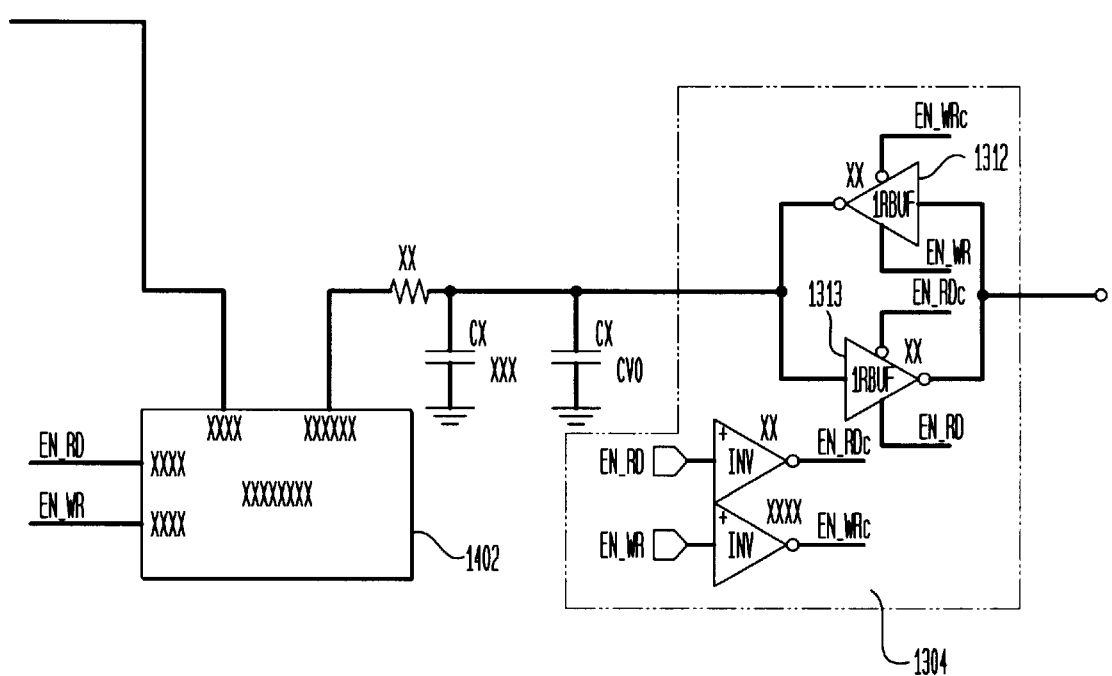

FIGS. 14a, 14b and 14c (referred to collectively as FIG. 14) shows, in accordance with one embodiment of the present invention, the DRAM circuit portion of FIG. 13, including a bi-directional repeater 1402 disposed in between driver/receiver pair 1304 and the driver/receiver pairs of the cell array.

Bi-directional repeater 1402 is preferably disposed such that it is positioned on RWD line 1302 between driver/receiver pair 1304 and all reduced voltage driver/receiver pairs 1306. That is, it is preferable that any data written to or read from a driver/receiver pair 1306 via the RWD line traverses the bi-directional repeater. When so disposed, bi-directional repeater 1402 serves to decouple a portion of the capacitance associated with RWD line 1302 to improve performance during reading and writing. Note that FIG. 14 is not drawn to scale, e.g., in DRAMS the resistance Rx representing the resistance of a spine RWD can be substantial, i.e., R1+R2+R3. Further, the presence of bi-directional repeater 1402 reduces the amount of resistance seen by driver 1310 of driver/receiver pair 1306 when reading data and reduces the amount of resistance seen by driver 1312 of driver/receiver pair 1304 when writing data to the cell.

As can be seen from the foregoing, the use of the repeater of the present invention advantageously reduces the propagation delay associated with high capacitance, high resistance load lines. Furthermore, the use of the repeater of the present invention at strategic locations on the high capacitive load, high resistance lines advantageously improves signaling, i.e., improving the rise and fall edges to counteract the attenuation effects and/or propagation delay of the signal line. The improvement of the rise and fall times is essential to realize high bandwidth data transfer. Without this improvement, the timing window for which the transmitted data is valid is reduced and consequently the frequency at which the bus can be run is limited. If a reduced voltage unidirectional or bi-directional repeater is implemented on an integrated circuit (such as a DRAM, a microprocessor, a DSP chip, or the like) that also employs reduced voltage signals, further advantages in terms of power dissipation, electrical noise, electromigration, and chip area usage is also realized.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In an integrated circuit, a method for implementing a reduced voltage repeater circuit on a signal line having thereon reduced voltage signals, said reduced voltage signals having a voltage level that is below $V_{DD}$, said reduced voltage repeater circuit being configured to be coupled to said signal line and having an input node coupled to a first portion of said signal line for receiving a first reduced voltage signal and an output node coupled to a second portion of said signal line for outputting a second reduced voltage signal, comprising:

coupling said input node to said first portion of said signal line, said input node being coupled to an input stage of said reduced voltage repeater circuit, said input stage being configured to receive said first reduced voltage signal on said signal line, said input stage is also coupled to a level shifter stage that is arranged to output a set of level shifter stage control signals responsive to said first reduced voltage signal, a voltage range of said set of level shifter stage control signals being higher than a voltage range associated with said first reduced voltage signal; and coupling said output node to said second portion of said signal line, said output node also being coupled to an output stage of said reduced voltage repeater circuit, said output stage being configured to output said second reduced voltage signal on said output node responsive to said set of level shifter stage control signals, a voltage range of said second reduced voltage signal being lower than said voltage range of said set of level shifter stage control signals.

2. The method of claim 1 further comprising receiving a repeater enable signal, said repeater enable signal, when enabled, permits said output stage to output said second reduced voltage signal on said output node responsive to said set of level shifter stage control signals, said repeater enable signal, when disabled, decouples said output node from said input stage and said level shifter stage.

3. The method of claim 1 wherein said output stage is coupled to a first voltage source, said level shifter stage being coupled to a second voltage source that supplies a higher voltage than a voltage level supplied by said first voltage source.

4. The method of claim 3 wherein said input stage includes a first field-effect transistor and a second field-effect transistor, first terminals of said first and second field-effect transistors being configured to receive said first reduced voltage signal.

5. The method of claim 4 further comprising receiving a repeater enable signal, gates of said first and second field-effect transistors are controlled by said repeater enable signal.

6. The method of claim 4 wherein second terminals of said first and second field-effect transistors are coupled to respective first and second input nodes of said level shifter stage.

7. The method of claim 6 wherein said level shifter stage includes a third field-effect transistor, a fourth field-effect transistor, and a fifth field-effect transistor, a gate of said third field-effect transistor being coupled to said first input node of said level shifter stage and a first terminal of said fourth field-effect transistor, a gate of said fourth field-effect transistor being coupled to a first terminal of said third field-effect transistor, a gate of said fifth field-effect transistor being coupled to said second input node of said level shifter stage, a first terminal of said fifth field-effect transistor being coupled to Vss.

8. The method of claim 7 wherein said third and fourth field-effect transistors represent p-type field-effect transistors, said first, second, and fifth field-effect transistors represent n-type field-effect transistors.

9. The method of claim 7 wherein said reduced voltage repeater circuit further including an inverter circuit, a first inverter circuit terminal of said inverter circuit being coupled to said first terminal of said third field-effect transistor and a second terminal of said fifth field-effect transistor, a second inverter circuit terminal of said inverter circuit being coupled to an input node of said output stage, a third inverter circuit terminal of said inverter circuit being coupled to said repeater enable signal.

10. The method of claim 9 wherein said reduced voltage repeater circuit further including an inverter having an inverter input and an inverter output, said inverter input being coupled to said repeater enable signal, said inverter output being coupled to a fourth inverter circuit terminal of said inverter circuit.

11. The method of claim 3 wherein said output stage consists essentially of two output field-effect transistors in series between said first voltage source and Vss.

12. The method of claim 11 wherein said two output field-effect transistors are n-type field-effect transistors.

13. The method of claim 3 wherein said output stage comprises a plurality of output field-effect transistors coupled in series between said first voltage source and Vss.

14. The method of claim 1 wherein said reduced voltage signals have a voltage level that is less than or equal to 1 V.

15. The method of claim 1 wherein said signal line represents an address line of a dynamic random access memory (DRAM) circuit.

16. The method of claim 1 wherein said signal line represents an address line of an integrated circuit.

17. The method of claim 1 wherein said signal line represents a read data line a memory circuit.

18. The method of claim 1 wherein said signal line represents a write data line a memory circuit.

19. The method of claim 1 wherein said signal line represents a clock line of an integrated circuit.

20. The method of claim 1 wherein said signal line represents a command line of an integrated circuit.

21. The method of claim 1 wherein said signal line represents a signal carrying conductor of an integrated circuit.

22. The method of claim 1 wherein said integrated circuit represents a microprocessor circuit.

23. In an integrated circuit, a method for implementing a reduced voltage repeater circuit on a signal line having thereon reduced voltage signals, said reduced voltage signals having a voltage level that is below $V_{DD}$, said reduced voltage repeater circuit being configured to be coupled to said signal line and having an input node coupled to a first portion of said signal line for receiving a first reduced voltage signal and an output node coupled to a second portion of said signal line for outputting a second reduced voltage signal, comprising:

receiving said first reduced voltage signal using an input stage of a reduced voltage repeater circuit, said input stage being coupled to said input node;

forming, using a level shifter stage of said reduced voltage repeater circuit, a set of control signals responsive to said first reduced voltage signal, a voltage range of said set of control signals being higher than a voltage range associated with said first reduced voltage signal; and outputting, using an output stage of said reduced voltage repeater circuit, a second reduced voltage signal responsive to said set of control signals, a voltage range associated with said second reduced voltage signal being lower than said voltage range of said control signals.

24. The method of claim 23 further comprising receiving a repeater enable signal, said repeater enable signal, when enabled, permits said output stage to output said second reduced voltage signal, said repeater enable signal, when disabled, tri-states said output stage.

25. The method of claim 23 wherein said outputting further comprising:

providing said set of control signals to gates of first and second field effect transistors of said output stage, said first and second field effect transistors being coupled serially between a first voltage source and ground, said first voltage source and said ground being configured to provide said voltage range associated with said second reduced voltage signal at an output of said reduced voltage repeater circuit.

26. The method of claim 23 wherein said reduced voltage signal have a voltage level that is less than or equal to 1 V.

27. The method of claim 23 wherein said signal line represents an address line of a dynamic random access memory (DRAM) circuit.

28. The method of claim 23 wherein said integrated circuit represents a microprocessor circuit.

29. In an integrated circuit, a method for implementing a reduced voltage bi-directional repeater circuit on a signal line having thereon reduced voltage signals, said reduced voltage signals having a voltage level that is below $V_{DD}$, said reduced voltage bi-directional repeater circuit being configured to be coupled to said signal line and having a first data port coupled to a first portion of said signal line and a second data port coupled to a second portion of said signal line, comprising:

receiving one of a first and second repeater enable signals at said reduced voltage bi-directional repeater circuit, said first repeater enable signal indicating a direction of signal transmission from said first data port to said second data port, said second repeater enable signal indicating a direction of transmission from said second data port to said first data port;

coupling said first data port to said first portion of said signal line, said first data port being coupled to both an input stage of a first reduced voltage repeater circuit and an output stage of a second reduced voltage repeater circuit;

coupling said second data port to said second portion of said signal line, said second data port being coupled to both an input stage of said second reduced voltage repeater circuit and an output stage of said first reduced voltage repeater circuit, wherein said input stage of said first reduced voltage repeater circuit is configured to receive, when said first repeater enable signal is enabled, a first reduced voltage signal on said first portion of said signal line, said input stage of said first reduced voltage repeater circuit is also coupled to a level shifter stage of said first reduced voltage repeater circuit that is arranged to output, when said first repeater enable signal is enabled, a first set of level shifter stage control signals responsive to said first reduced voltage signal, a voltage range of said first set of level shifter stage control signals being higher than a voltage range associated with said first reduced voltage signal, said output stage of said first reduced voltage repeater circuit being configured to output, when said first repeater enable signal is enabled, a second reduced voltage signal on said second port responsive to said first set of level shifter stage control signals, a voltage range of said second reduced voltage signal being lower than said voltage range of said first set of level shifter stage control signals, said first repeater enable signal tri-stating said output stage of said second reduced voltage repeater circuit from said first data port, and wherein said input stage of said second reduced voltage repeater circuit is configured to receive, when said second repeater enable signal is enabled, a third reduced voltage signal on said second portion of said signal line, said input stage of said second reduced voltage repeater circuit is also coupled to a level shifter stage of said second reduced voltage repeater circuit that is arranged to output, when said second repeater enable signal is enabled, a second set of level shifter stage control signals responsive to said third reduced voltage signal, a voltage range of said second set of level shifter stage control signals being higher than a voltage range associated with said third reduced voltage signal, said output stage of said second reduced voltage repeater circuit being configured to output, when said second repeater enable signal is enabled, a fourth reduced voltage signal on said first port responsive to said second set of level shifter stage control signals, a voltage range of said fourth reduced voltage signal being lower than said voltage range of said second set of level shifter stage control signals, said second repeater enable signal tri-stating said output stage of said first reduced voltage repeater circuit from said second data port.

30. The method of claim 29 wherein said second repeater enable signal is a complementary signal of said first repeater enable signal.

31. The method of claim 29 wherein said output stage of said first reduced voltage repeater circuit is coupled to a first voltage source, said level shifter stage of said first reduced voltage repeater circuit being coupled to a second voltage source that supplies a higher voltage than a voltage level supplied by said first voltage source.

32. The method of claim 31 wherein said input stage of said first reduced voltage repeater circuit includes a first field-effect transistor and a second field-effect transistor, gates of said first and second field-effect transistors being controlled by said first repeater enable signal, first terminals of said first and second field-effect transistors being configured to receive said first reduced voltage signal.

33. The method of claim 32 wherein second terminals of said first and second field-effect transistors are coupled to respective first and second input nodes of said level shifter stage of said first reduced voltage repeater circuit.

34. The method of claim 33 wherein said level shifter stage of said first reduced voltage repeater circuit includes a third field-effect transistor, a fourth field-effect transistor, and a fifth field-effect transistor, a gate of said third field-effect transistor being coupled to said first input node of said level shifter stage of said first reduced voltage repeater circuit and a first terminal of said fourth field-effect transistor, a gate of said fourth field-effect transistor being coupled to a first terminal of said third field-effect transistor, a gate of said fifth field-effect transistor being coupled to said second input node of said level shifter stage of said first reduced voltage repeater circuit, a first terminal of said fifth field-effect transistor being coupled to Vss.

35. The method of claim 34 wherein said third and fourth field-effect transistors represent p-type field-effect transistors, said first, second, and fifth field-effect transistors represent n-type field-effect transistors.

36. The method of claim 34 further including a inverter circuit, a first inverter circuit terminal of said inverter circuit being coupled to said first terminal of said third field-effect transistor and a second terminal of said fifth field-effect transistor, a second inverter circuit terminal of said inverter circuit being coupled to a first port of said output stage of said first reduced voltage repeater circuit, a third inverter circuit terminal of said inverter circuit being coupled to said first repeater enable signal.

37. The method of claim 36 further including an inverter having an inverter input and an inverter output, said inverter input being coupled to said first repeater enable signal, said inverter output being coupled to a fourth inverter circuit terminal of said inverter circuit.

38. The method of claim 31 wherein said output stage of said first reduced voltage repeater circuit consists essentially of two output field-effect transistors in series between said first voltage source and Vss.

39. The method of claim 38 wherein said two output field-effect transistors are n-type field-effect transistors.

40. The method of claim 31 wherein said output stage of said first reduced voltage repeater circuit comprises a plurality of output field-effect transistors coupled in series between said first voltage source and Vss.

41. The method of claim 29 wherein said signal line represents a read write data (RWD) line of a dynamic random access memory (DRAM) circuit.

42. The method of claim 29 wherein said signal line represents an address line of an integrated circuit.

43. The method of claim 29 wherein said signal line represents a read data line a memory circuit.

44. The method of claim 29 wherein said signal line represents a write data line a memory circuit.

45. The method of claim 29 wherein said signal line represents a clock line of an integrated circuit.

46. The method of claim 29 wherein said signal line represents a command line of an integrated circuit.

47. The method of claim 29 wherein said signal line represents a signal carrying conductor of an integrated circuit.

48. The method of claim 29 wherein said integrated circuit represents a microprocessor circuit.

49. A reduced voltage bi-directional repeater circuit configured to be coupled to a reduced voltage bi-directional repeater circuit on a signal line having thereon reduced voltage signals, said reduced voltage signals having a voltage level that is below $V_{DD}$, said reduced voltage bi-directional repeater circuit being configured to be coupled to said signal line and having a first data port configured to be coupled to a first portion of said signal line and a second data port configured to be coupled to a second portion of said signal line, comprising:

a first enable node configured to receive a first repeater enable signal at said reduced voltage bi-directional repeater circuit, said first repeater enable signal indicating a direction of signal transmission from said first data port to said second data port;

a second enable node configured to receive a second repeater enable signal at said reduced voltage bi-directional repeater circuit, said second repeater enable signal indicating a direction of signal transmission from said second data port to said first data port;

wherein said first data port is coupled to both an input stage of a first reduced voltage repeater circuit and an output stage of a second reduced voltage repeater circuit, said second data port is coupled to both an input stage of said second reduced voltage repeater circuit and an output stage of said first reduced voltage repeater circuit, said input stage of said first reduced voltage repeater circuit is configured to receive, when said first repeater enable signal is enabled, a first reduced voltage signal on said first portion of said signal line, said input stage of said first reduced voltage repeater circuit is also coupled to a level shifter stage of said first reduced voltage repeater circuit that is arranged to output, when said first repeater enable signal is enabled, a first set of level shifter stage control signals responsive to said first reduced voltage signal, a voltage range of said first set of level shifter stage control signals being higher than a voltage range associated with said first reduced voltage signal, said output stage of said first reduced voltage repeater circuit being configured to output, when said first repeater enable signal is enabled, a second reduced voltage signal on said second port responsive to said first set of level shifter stage control signals, a voltage range of said second reduced voltage signal being lower than said voltage range of said first set of level shifter stage control signals, said first repeater enable signal tri-stating said output stage of said second reduced voltage repeater circuit from said first data port, and wherein said input stage of said second reduced voltage repeater circuit is configured to receive, when said second repeater enable signal is enabled, a third reduced voltage signal on said second portion of said signal line, said input stage of said second reduced voltage repeater circuit is also coupled to a level shifter stage of said second reduced voltage repeater circuit that is arranged to output, when said second repeater enable signal is enabled, a second set of level shifter stage control signals responsive to said third reduced voltage signal, a voltage range of said second set of level shifter stage control signals being higher than a voltage range associated with said third reduced voltage signal, said output stage of said second reduced voltage repeater circuit being configured to output, when said second repeater enable signal is enabled, a fourth reduced voltage signal on said first port responsive to said second set of level shifter stage control signals, a voltage range of said fourth reduced voltage signal being lower than said voltage range of said second set of level shifter stage control signals, said second repeater enable signal tri-stating said output stage of said first reduced voltage repeater circuit from said second data port.

50. The reduced voltage bi-directional repeater circuit of claim 49 wherein said second repeater enable signal is a complementary signal of said first repeater enable signal.

51. The reduced voltage bi-directional repeater circuit of claim 49 wherein said output stage of said first reduced voltage repeater circuit is coupled to a first voltage source, said level shifter stage of said first reduced voltage repeater circuit being coupled to a second voltage source that supplies a higher voltage than a voltage level supplied by said first voltage source.

52. The reduced voltage bi-directional repeater circuit of claim 49 wherein said input stage of said first reduced voltage repeater circuit includes a first field-effect transistor and a second field-effect transistor, gates of said first and second field-effect transistors being controlled by said first repeater enable signal, first terminals of said first and second field-effect transistors being configured to receive said first reduced voltage signal.

53. The reduced voltage bi-directional repeater circuit of claim 52 wherein second terminals of said first and second field-effect transistors are coupled to respective first and second input nodes of said level shifter stage of said first reduced voltage repeater circuit.

54. The reduced voltage bi-directional repeater circuit of claim 53 wherein said level shifter stage of said first reduced voltage repeater circuit includes a third field-effect transistor, a fourth field-effect transistor, and a fifth field-effect transistor, a gate of said third field-effect transistor being coupled to said first input node of said level shifter stage of said first reduced voltage repeater circuit and a first terminal of said fourth field-effect transistor, a gate of said fourth field-effect transistor being coupled to a first terminal of said third field-effect transistor, a gate of said fifth field-effect transistor being coupled to said second input node of said level shifter stage of said first reduced voltage repeater circuit, a first terminal of said fifth field-effect transistor being coupled to Vss.

55. The reduced voltage bi-directional repeater circuit of claim 54 wherein said third and fourth field-effect transistors represent p-type field-effect transistors, said first, second, and fifth field-effect transistors represent n-type field-effect transistors.

56. The reduced voltage bi-directional repeater circuit of claim 54 further including a inverter circuit, a first inverter circuit terminal of said inverter circuit being coupled to said first terminal of said third field-effect transistor and a second terminal of said fifth field-effect transistor, a second inverter circuit terminal of said inverter circuit being coupled to a first port of said output stage of said first reduced voltage repeater circuit, a third inverter circuit terminal of said inverter circuit being coupled to said first repeater enable signal.

57. The reduced voltage bi-directional repeater circuit of claim 56 further including an inverter having an inverter input and an inverter output, said inverter input being coupled to said first repeater enable signal, said inverter output being coupled to a fourth inverter circuit terminal of said inverter circuit.

58. The reduced voltage bi-directional repeater circuit of claim 51 wherein said output stage of said first reduced voltage repeater circuit consists essentially of two output field-effect transistors in series between said first voltage source and Vss.

59. The reduced voltage bi-directional repeater circuit of claim 58 wherein said two output field-effect transistors are n-type field-effect transistors.

60. The reduced voltage bi-directional repeater circuit of claim 51 wherein said output stage of said first reduced voltage repeater circuit comprises a plurality of output field-effect transistors coupled in series between said first voltage source and Vss.

61. The reduced voltage bi-directional repeater circuit of claim 49 wherein said signal line represents a read write data (RWD) line of a dynamic random access memory (DRAM) circuit.

62. The reduced voltage bi-directional repeater circuit of claim 49 wherein said integrated circuit represents a microprocessor circuit.

* * * * *